(12) United States Patent
Yamazaki et al.

(10) Patent No.: US 8,124,973 B2
(45) Date of Patent: Feb. 28, 2012

(54) ELECTRONIC APPLIANCE INCLUDING TRANSISTOR HAVING LDD REGION

(75) Inventors: Shunpei Yamazaki, Kanagawa-Ken (JP); Jun Koyama, Kanagawa-Ken (JP); Hideomi Suzawa, Kanagawa-Ken (JP); Koji Ono, Kanagawa-Ken (JP); Tatsuya Arao, Kanagawa-Ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 707 days.

(21) Appl. No.: 11/469,768

(22) Filed: Sep. 1, 2006

(65) Prior Publication Data

US 2007/0246777 A1    Oct. 25, 2007

Related U.S. Application Data

(62) Division of application No. 10/838,267, filed on May 5, 2004, now Pat. No. 7,112,817, and a division of application No. 09/797,186, filed on Mar. 2, 2001, now Pat. No. 6,759,678.

(30) Foreign Application Priority Data

Mar. 6, 2000    (JP) ................................ 2000-060206

(51) Int. Cl.
  H01L 29/04    (2006.01)
  H01L 31/036   (2006.01)
  H01L 31/0376  (2006.01)
  H01L 31/20    (2006.01)

(52) U.S. Cl. ............... 257/59; 257/66; 257/72; 257/347

(58) Field of Classification Search .................. 257/59, 257/66, 72, 347
See application file for complete search history.

(56) References Cited

U.S. PATENT DOCUMENTS

| 4,394,182 A | 7/1983 | Maddox, III |
| 5,177,571 A | 1/1993 | Satoh et al. |
| 5,272,100 A | 12/1993 | Satoh et al. |
| 5,605,847 A | 2/1997 | Zhang |
| 5,643,826 A | 7/1997 | Ohtani et al. |
| 5,684,365 A | 11/1997 | Tang et al. |
| 5,717,224 A | 2/1998 | Zhang |
| 5,731,216 A | 3/1998 | Holmberg et al. |
| 5,750,430 A | 5/1998 | Son |
| 5,767,530 A | 6/1998 | Ha |
| 5,828,103 A | 10/1998 | Hsu |
| 5,886,364 A | 3/1999 | Zhang |

(Continued)

FOREIGN PATENT DOCUMENTS

CN    1241025    1/2000

(Continued)

OTHER PUBLICATIONS

Office action (Chinese Application No. 200610095692.8) dated May 9, 2008 with English translation.

(Continued)

*Primary Examiner* — Thien F Tran
(74) *Attorney, Agent, or Firm* — Fish & Richardson P.C.

(57) ABSTRACT

A high reliability semiconductor display device is provided. A semiconductor layer in the semiconductor display device has a channel forming region, an LDD region, a source region, and a drain region, and the LDD region overlaps a first gate electrode, sandwiching a gate insulating film.

28 Claims, 23 Drawing Sheets

U.S. PATENT DOCUMENTS

| | | | |
|---|---|---|---|
| 5,923,962 A | 7/1999 | Ohtani et al. |
| 5,966,193 A | 10/1999 | Zhang et al. |
| 5,986,305 A | 11/1999 | Wu |
| 5,990,491 A | 11/1999 | Zhang |
| 6,031,290 A | 2/2000 | Miyazaki et al. |
| 6,088,070 A | 7/2000 | Ohtani et al. |
| 6,096,585 A | 8/2000 | Fukuda et al. |
| 6,114,183 A | 9/2000 | Hamada et al. |
| 6,166,414 A | 12/2000 | Miyazaki et al. |
| 6,225,150 B1 | 5/2001 | Lee et al. |
| 6,259,138 B1 | 7/2001 | Ohtani et al. |
| 6,297,862 B1 | 10/2001 | Murade |
| 6,335,290 B1 | 1/2002 | Ishida |
| 6,335,540 B1 | 1/2002 | Zhang |
| 6,346,717 B1 | 2/2002 | Kawata |
| 6,365,917 B1 | 4/2002 | Yamazaki |
| 6,369,410 B1 | 4/2002 | Yamazaki et al. |
| 6,388,721 B1 | 5/2002 | Murade |
| 6,399,960 B1 | 6/2002 | Yamazaki et al. |
| 6,403,406 B2 | 6/2002 | Lee et al. |
| 6,462,802 B1 | 10/2002 | Nishimura et al. |
| 6,501,097 B1 | 12/2002 | Zhang |
| 6,534,789 B2 | 3/2003 | Ishida |
| 6,559,906 B1 | 5/2003 | Kawachi et al. |
| 6,573,955 B2 | 6/2003 | Murade |
| 6,618,029 B1 | 9/2003 | Ozawa |
| 6,642,544 B1 | 11/2003 | Hamada et al. |
| 6,661,096 B1 | 12/2003 | Takayama et al. |
| 6,670,641 B1 | 12/2003 | Fukuda et al. |
| 7,112,817 B2 * | 9/2006 | Yamazaki et al. ............... 257/59 |
| 7,226,822 B2 | 6/2007 | Takayama et al. |
| 7,235,810 B1 | 6/2007 | Yamazaki et al. |
| 7,245,018 B1 | 7/2007 | Takayama et al. |
| 7,397,451 B2 | 7/2008 | Ozawa |
| 7,460,094 B2 | 12/2008 | Ozawa |
| 2001/0008781 A1 | 7/2001 | Lee et al. |
| 2001/0019127 A1 | 9/2001 | Ishida |
| 2001/0052950 A1 | 12/2001 | Yamazaki et al. |
| 2002/0000551 A1 | 1/2002 | Yamazaki et al. |
| 2002/0005905 A1 | 1/2002 | Yamazaki et al. |
| 2002/0024622 A1 | 2/2002 | Murade |
| 2002/0063261 A1 | 5/2002 | Zhang |
| 2002/0118322 A1 | 8/2002 | Murade |
| 2002/0134983 A1 | 9/2002 | Yamazaki |
| 2002/0149016 A1 | 10/2002 | Yamazaki et al. |
| 2003/0116766 A1 | 6/2003 | Zhang |
| 2003/0151568 A1 | 8/2003 | Ozawa |
| 2003/0211662 A1 | 11/2003 | Yamazaki et al. |
| 2007/0224791 A1 | 9/2007 | Takayama et al. |
| 2007/0281401 A1 | 12/2007 | Yamazaki et al. |
| 2008/0014666 A1 | 1/2008 | Takayama et al. |
| 2008/0158209 A1 | 7/2008 | Ozawa |
| 2008/0165174 A1 | 7/2008 | Ozawa |
| 2008/0198152 A1 | 8/2008 | Ozawa |

FOREIGN PATENT DOCUMENTS

| | | |
|---|---|---|
| CN | 1258103 | 6/2000 |
| EP | 0935229 | 8/1999 |
| EP | 1 001 467 | 5/2000 |
| EP | 1 003 223 | 5/2000 |
| EP | 1 005 093 | 5/2000 |
| EP | 1006589 | 6/2000 |
| EP | 1 031 873 | 8/2000 |
| EP | 1 041 641 | 10/2000 |
| EP | 1045436 | 10/2000 |
| EP | 1505650 | 2/2005 |
| EP | 1505651 | 2/2005 |
| EP | 1505652 | 2/2005 |
| JP | 5-243262 | 9/1993 |
| JP | 06-148685 | 5/1994 |
| JP | 07-130652 | 5/1995 |
| JP | 07-235680 | 9/1995 |
| JP | 08-078329 | 3/1996 |
| JP | 08-274336 | 10/1996 |
| JP | 10-135468 | 5/1998 |
| JP | 10-135469 | 5/1998 |
| JP | 10-163498 | 6/1998 |
| JP | 10-172762 | 6/1998 |
| JP | 10-233511 | 9/1998 |
| JP | 11-261075 | 9/1999 |
| JP | 11-271792 | 10/1999 |
| JP | 11-274502 | 10/1999 |
| JP | 2000-047263 | 2/2000 |
| JP | 2000036598 | 2/2000 |
| JP | 2001-210832 | 8/2001 |
| WO | WO-98/16868 | 4/1998 |
| WO | WO99/35678 | 7/1999 |
| WO | WO-99/39241 | 8/1999 |

OTHER PUBLICATIONS

Australian Patent Office Supplementary Search report (Application No. SG 200101320-0), Sep. 24, 2004, 5 pages.

Hatano et al., "A Novel Self-aligned Gate-overlapped LDD Poly-Si TFT with High Reliability and Performance", IEDM Technical Digest 97, 1997, pp. 523-526.

M. A. Baldo et al., "Highly Efficient Phosphorescent Emission from Organic Electroluminescent Devices", Nature vol. 395, Sep. 10, 1998, pp. 151-154.

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

Tsutsui et al., "High Quantum Efficiency in Organic Light-Emitting Devices with Iridium-Complex as a Triplet Emissive Center", Japanese Journal of Applied Physics vol. 38, Part 12B, Dec. 15, 1999, pp. L1502-L1504.

Tsutsui et al., "Electroluminescence in Organic Thin Films", Photochemical Processes in Organized Molecular Systems, 1991, pp. 437-450.

Yamazaki et al.; U.S. Appl. No. 09/454,146, (Pending), filed Mar. 12, 1999.

European Search Report for Application No. EP 01105599.3, dated Mar. 20, 2009, 5 pages.

"Search Report (Application No. 200601674-5; SG4702D1) Dated Mar. 23, 2009,".

* cited by examiner

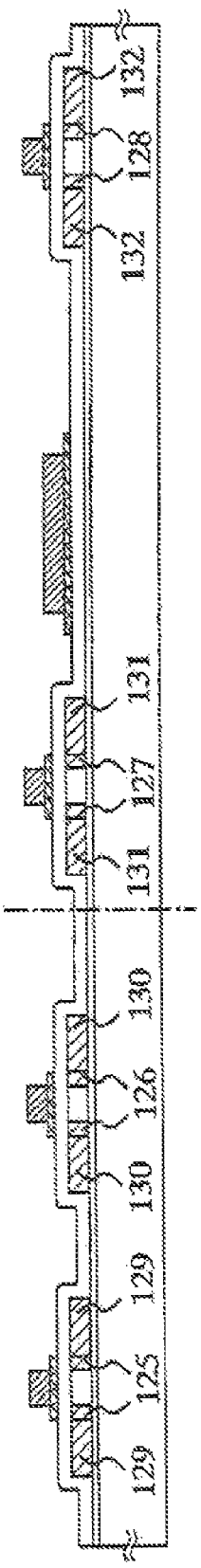
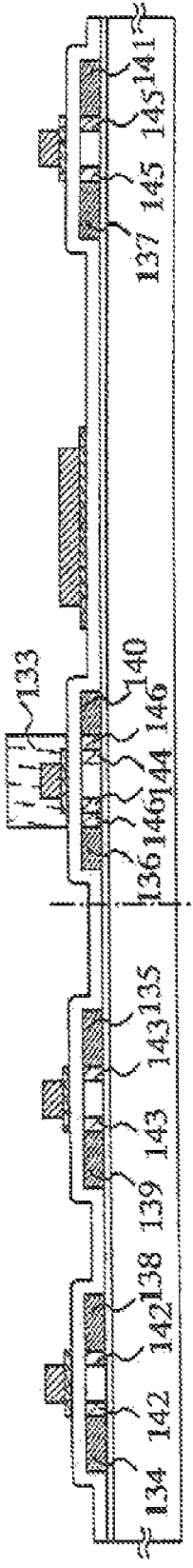
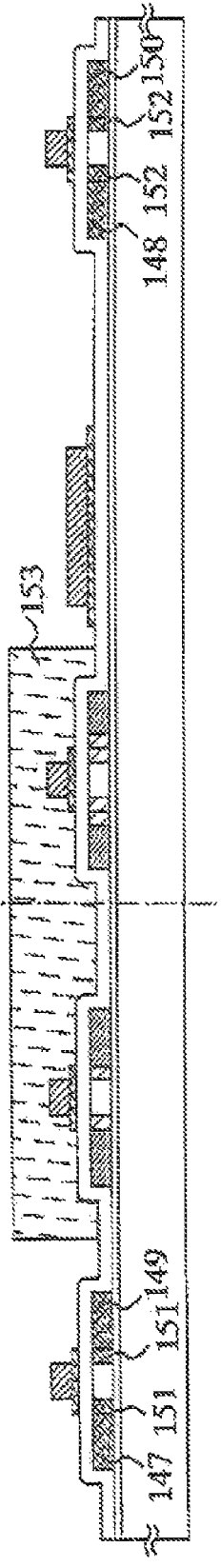

ELECTRONIC APPLIANCE INCLUDING TRANSISTOR HAVING LDD REGION

BACKGROUND OF THE INVENTION

1. Field of the Invention

The present invention relates to a semiconductor display device using a semiconductor element (an element using a semiconductor thin film). Further, the present invention relates to electronic equipment using the semiconductor display device in a display portion.

2. Description of the Related Art

Techniques of using a semiconductor thin film (on the order of several nm to several hundreds of nm thick) formed on a substrate having an insulating surface in order to form a thin film transistor (TFT) have been in the spotlight in recent years. Thin film transistors are widely applied to electronic devices such as ICs and semiconductor display-devices, and in particular, are rapidly being developed as switching elements for liquid crystal display devices and EL display devices.

EL display devices are also referred to as organic EL displays (OELDs) and as organic light-emitting diodes (OLEDs).

EL display devices are self-light-emitting. EL devices have a structure in which a layer containing an organic compound (EL layer) is sandwiched between a pair of electrodes (an anode and a cathode), and the EL layer usually has a lamination structure. A lamination structure of a hole transporting layer, a light-emitting layer, and an electron transporting layer developed by Tang, et al., of Eastman Kodak Company can be given as a typical lamination structure. This structure has extremely high light-emitting efficiency, and most of the EL display devices currently being researched and developer employ this structure.

Electro luminescence generated by the addition of an electric field is obtained in the EL element, which has an anode layer, an EL layer, and a cathode layer. There is emission of light in the organic compound when returning to a base state from a singlet excitation state (fluorescence), and when returning to a base state from a triplet excitation state (phosphorescence), and the EL display device of the present invention may use both types of light emission.

Further, a structure in which a hole injecting layer, a hole transporting layer, a light-emitting layer, and an electron transporting layer are laminated in order on an anode; and a structure in which a hole injecting layer, a hole transporting layer, a light-emitting layer, an electron transporting layer, and an electron injecting layer are laminated in order on an anode may also be used. Doping of a material such as a fluorescent pigment into the light-emitting layer may also be performed.

All layers formed between an anode and a cathode are referred to generically as an EL layer within this specification. The above stated hole injecting layer, hole transporting layer, light-emitting layer, electron transporting layer, and electron injecting layer are therefore all contained within the EL layer.

Note that the emission of light by the EL element is referred to as driving of the EL element in this specification. Note also that, throughout this specification, light-emitting elements formed by an anode, an EL layer, and a cathode are referred to as EL elements.

An active matrix EL display device has a pixel portion with a plurality of pixels, each of which has a TFT and an EL element. An image is displayed in the pixel portion by controlling the electric current flowing in the EL element with TFT.

In particular, a high mobility can be obtained from a TFT using a semiconductor film having a crystalline structure as an active layer (crystalline TFT), and it is therefore possible to integrate functionality circuits on the same substrate and realize a high definition image display.

Semiconductor films having a crystalline structure include single crystal semiconductors, polycrystalline semiconductors, and microcrystalline semiconductors in this specification, and in addition, include the semiconductors disclosed in Japanese Patent Application Laid-open No. Hei 7-130652, Japanese Patent Application Laid-open No. Hei 8-78329, Japanese Patent Application Laid-open No. Hei 10-135468, and Japanese Patent Application Laid-open No. Hei 10-135469.

Between one million and two million crystalline TFTs are necessary in only a pixel matrix circuit (hereafter referred to as pixel portion) in order to structure the active matrix EL display device, and more than that number of crystalline TFTs are required for the attached functionality circuits formed in the periphery. The specifications required for the EL display device are strict, and in order to perform stable image display, it is necessary to assure the reliability of each crystalline TFT.

TFT characteristics can be considered as divided between those of an on state and those of an off state. Characteristics such as on current, mobility, S-value, and threshold value are known as on state characteristics, and off current is the most important off state characteristic.

However, there is a problem in that the off current easily becomes high with crystalline TFTs.

Furthermore, crystalline TFTs are still not used in MOS transistors (transistors manufactured on a single crystalline semiconductor substrate) using LSIs from a reliability standpoint. For example, a degradation phenomenon in which the mobility and the on current (the electric current flowing when the TFT is in an on state) drop, and the off current (the electric current flowing when the TFT is in an off state) rise, when a crystalline TFT is continuously driven have been observed. It is thought that the hot carrier effect is the cause, and that the degradation phenomenon is caused by hot carriers developing due to a high electric field in the vicinity of a drain.

A lightly doped drain (LDD) structure is known as a method of lowering the off current in a MOS transistor by relieving the high electric field in the vicinity, of the drain. A low concentration impurity region is formed on the outside of a channel region with this structure, and the low concentration impurity region is referred to as an LDD region.

In particular, the high electric field in the vicinity of the drain is relieved, the hot carrier effect can be prevented, and the reliability can be increased when there is a structure in which the LDD region overlaps with a gate electrode through a gate insulating film (gate-drain overlapped LDD, GOLD structure). Note that a region in which the LDD region overlaps with the gate electrode through the gate insulating film is referred to as an Lov region (first LDD region) ("ov" indicates "overlap) in this specification.

Note also that structures such as an LATID (large tilt angle implanted drain) structure and an ITLDD (inverse T LDD) structure are known as GOLD structures. There is a GOLD structure in which sidewalls are formed by silicon, for example, reported in Hatano, M. Akimoto, H, and Sakai, T, IEDM97 Technical Digest, p. 523-6, 1997, and it has been confirmed that an extremely superior reliability can be obtained compared with other TFT structures.

Note that, in this specification, a region in which the LDD region does not overlap with the gate electrode through the gate insulating film is referred to as an Loff region (second LDD region) ("off" indicates "offset") in this specification.

Several methods of manufacturing a TFT possessing both an Loff region and an Lov region have been proposed. A method of using a mask, and a method using a gate electrode having two layers with mutually differing widths and a gate insulating film by self-alignment, can be given as methods of forming the Lov region and the Loff reunion.

However, two masks are required in order to form the Lov region and the Loff region when using a mask, and the number of process steps is increased. On the other hand, when forming the Lov region and the Loff region by self alignment, the number of masks need not be increased, and it is possible to suppress the number of process steps. However, the width of the gate electrode and the thickness of the gate insulating film influence the position in which the Lov region and the Loff region are formed. The etching rates of the gate electrode and the gate insulating film differ, and it is difficult to precisely control the positional alignment of the Lov region and the Loff region.

SUMMARY OF THE INVENTION

In view of the above, an object of the present invention is to suppress the number of masks when forming an Lov region and an Loff region, and further, to easily form an Lov region and an Loff region at desired locations. Further, an object of the present invention is realize a crystalline TFT in which good characteristics can be obtained in both an on state and an off state. Another object of the present invention is to realize a high reliability semiconductor display device having a semiconductor circuit formed by this type of crystalline TFT.

An impurity is added to a semiconductor layer by using a self-aligning manner in which a gate electrode is utilized, and by using a mask, forming an Lov region and an Loff region. The date electrode is formed from a two layer conducting film, and a layer closer to a semiconductor layer (a first gate electrode) is made longer in a channel longitudinal direction (a channel length direction) than a layer farther from the semiconductor layer (a second electrode).

Note that, in this specification, the term channel longitudinal direction refers to a direction between a source region and a drain region in which a carrier moves.

The lengths of the channel longitudinal direction (carrier movement direction) of the first gate electrode and the second gate electrode (hereafter referred to simply as the gate electrode width) differ in the present invention. By performing ion injection with the first gate electrode and the second gate electrode as masks, and utilizing the difference in ion penetration depth due to the difference in the thicknesses of the gate electrodes, it is therefore possible to make the ion concentration within the semiconductor layer located beneath the second gate electrode lower than the ion concentration within the semiconductor layer located below the first gate electrode, without positioning below the second gate electrode. In addition, it is possible to make the ion concentration within the semiconductor layer located below the first gate electrode lower than the ion concentration of the semiconductor layer not located below the first gate electrode, without positioning below the second gate electrode.

Further, the Loff region is formed using masks, and therefore only the width of the first gate electrode and the width of the second gate electrode must be controlled by etching, and control of the location of the Loff region and the location of the Lov region becomes easy compared to that of conventional examples. Consequently, minute positional alignment of the Lov region and the Loff region becomes easy, and it also becomes easy to manufacture a TFT having desired characteristics.

Structures of the present invention are shown below.

A structure of the present invention is a semiconductor display device having: a semiconductor layer formed on an insulating surface; a gate insulating film contacting the semiconductor layer; a first gate electrode contacting the gate insulating film; and a second gate electrode contacting the first gate electrode;

characterized in that:
the semiconductor layer has a channel forming region, LDD regions contacting the channel forming region, and a source region and a drain region contacting the LDD regions;
the width of the first gate electrode in a channel longitudinal direction is wider than the width of the second gate electrode in the channel longitudinal direction; and
the LDD regions overlap the first gate electrode sandwiching the gate insulating film.

Another structure of the present invention is a semiconductor display device having: a semiconductor layer formed on an insulating surface; a gate insulating film contacting the semiconductor layer; a first gate electrode contacting the gate insulating film; and a second gate electrode contacting the first gate electrode;

characterized in that:
the semiconductor layer has a channel forming region, LDD regions contacting the channel forming region, and a source region and a drain region contacting the LDD regions;
the width of the first gate electrode in a channel longitudinal direction is wider than the width of the second gate electrode in the channel longitudinal direction;
the LDD regions overlap with the first gate electrode, sandwiching the gate insulating film; and
the channel forming region overlaps with the second gate electrode, sandwiching the gate insulating film.

Another structure of the present invention is a semiconductor display device having: a semiconductor layer formed on an insulating surface; a gate insulating film contacting the semiconductor layer; a first gate electrode contacting the gate insulating film; a second gate electrode contacting the first gate electrode; and an EL element;

characterized in that:
the semiconductor layer has a channel forming region, LDD regions contacting the channel forming region, and a source region and a drain region contacting the LDD regions;
the width of the first gate electrode in a channel longitudinal direction is wider than the width of the second gate electrode in the channel longitudinal direction;
the LDD regions overlap with the first gate electrode, sandwiching the gate insulating film;
the channel forming region overlaps with the second gate electrode, sandwiching the gate insulating film;
the EL element has an anode, a cathode, and an EL lawyer formed between the anode and the cathode; and
the drain region is electrically connected to the anode or the cathode.

Another structure of the present invention is a semiconductor display device having: a semiconductor layer formed on an insulating surface; a gate insulating film contacting the semiconductor layer; a first gate electrode contacting the gate insulating film; and a second gate electrode contacting the first gate electrode;

characterized in that:
the width of the first gate electrode in a channel longitudinal direction is wider than the width of the second gate electrode in the channel longitudinal direction;
the first gate electrode has a tapered shape in cross section in an end portion;
the semiconductor layer has a channel forming region, LDD regions contacting, the channel forming region, and a source region and a drain region contacting the LDD regions;
the LDD regions overlap with the first gate electrode, sandwiching the gate insulating film; and
the channel forming region overlaps with the second gate electrode sandwiching the gate insulating film.

The LDD regions in the above structures mar be formed in a self-aligning manner by adding an impurity element into the semiconductor layer with the second gate electrode as a mask.

With the present invention, the concentration of the impurity in the LDD regions at least contains a region having a concentration gradient in a range of $1\times10^{17}$ to $1\times10^{18}/cm^3$, and may be characterized in that the impurity element concentration increases as the distance from the channel forming region increases.

Another structure of the present invention is a semiconductor display device having a switching TFT and a driver circuit TFT;
in which:
the switching TFT and the driver circuit TFT each has a semiconductor layer formed on an insulating surface, a gate insulating film contacting the semiconductor layer, a first gate electrode contacting the gate insulating film, and a second gate electrode contacting the first gate electrode;
the width of the first gate electrode in a channel longitudinal direction is wider than the width of the second gate electrode in the channel longitudinal direction;
the semiconductor layer of the switching TFT has a channel forming region overlapping with the second gate electrode, sandwiching the gate insulating film; first LDD regions contacting the channel forming region and overlapping, with the first gate electrode, sandwiching the gate insulating film; second LDD regions contacting the first LDD regions; and a source region and a drain region contacting the second LDD regions; and
the semiconductor layer of the driver circuit TFT has a channel forming region overlapping with the second gate electrode, sandwiching the gate insulating film; third LDD regions contacting the channel forming region and overlapping with the first gate electrode, sandwiching the gate insulating film: and a source region and a drain region contacting the third LDD regions.

Another structure of the present invention is a semiconductor display device having a switching TFT and a driver circuit TFT;
in which:
the switching TFT and the driver circuit TFT each has a semiconductor layer formed on an insulating surface, a gate insulating film contacting the semiconductor layer, a first gate electrode contacting the gate insulating film, and a second gate electrode contacting the first gate electrode;
the width of the first gate electrode in a channel longitudinal direction is wider than the width of the second gate electrode in the channel longitudinal direction;
the first gate electrode has a tapered shape in cross section in an edge portion;
the semiconductor layer of the switching TFT has a channel forming region overlapping with the second gate electrode, sandwiching the gate insulating film; first LDD regions contacting the channel forming region and overlapping with the first gate electrode, sandwiching the gate insulating film; second LDD regions contacting the first LDD regions; and a source region and a drain region contacting the second LDD regions; and
the semiconductor layer of the driver circuit TFT has a channel forming region overlapping with the second gate electrode, sandwiching the gate insulating film; third LDD regions contacting the channel forming region and overlapping with the first gate electrode, sandwiching the gate insulating film; and a source region and a drain region contacting the third LDD regions.

With the present invention, the concentration of the impurity in the first LDD regions at least contains a region having a concentration gradient in a range of $1\times10^{17}$ to $1\times10^{18}/cm^3$, and the impurity element concentration increases as the distance from the channel forming region increases.

With the present invention, the concentration of the impunity in the third LDD regions at least contains a region having a concentration gradient in a range of $1\times10^{17}$ to $1\times10^{18}/cm^3$, and the impurity element concentration increases as the distance from the channel forming region increases.

With the present invention, the first LDD regions or the third LDD regions may be formed in a self-aligning manner by adding the impurity to the semiconductor layer with the second gate electrode as a mask.

Another structure of the present invention is a semiconductor display device having: a semiconductor layer formed on an insulating surface; a gate insulating film; a first gate electrode; a second gate electrode; a first wiring; a second wiring; a first interlayer insulating film; a second interlayer insulating film; and an intermediate wiring;
characterized in that:
the gate insulating film is formed over the insulating surface, covering the semiconductor layer;
the first gate electrode and the first wiring are formed contacting the gate insulating film;
the second gate electrode and the second wiring are formed contacting the first gate electrode and the first wiring, respectively;
the first gate electrode and the first wiring are formed from a first conducting film;
the second gate electrode and the second wiring are formed from a second conducting film;
the first interlayer insulating film is formed covering: the first gate electrode; the second gate electrode; the first wiring; the second wiring; and the gate insulating film;
the second interlayer insulating film is formed over the first interlayer insulating film;
the intermediate wiring is formed covering the second interlayer insulating film, and so as to contact the first interlayer insulating film through a contact hole formed in the second interlayer insulating film;
the intermediate wiring overlaps with the second wiring through the first interlayer insulating film in the contact hole;
the semiconductor layer has a channel forming region, LDD regions contacting the channel forming region, and a source region and a drain region contacting the LDD regions;
the width of the first gate electrode in a channel longitudinal direction is wider than the width of the second gate electrode in the channel longitudinal direction;

the channel forming region overlaps with the second gate electrode, sandwiching the gate insulating film; and the LDD regions overlap with the first gate electrode, sandwiching, the gate insulating film.

Another structure of the present invention is a semiconductor display device having: a semiconductor layer formed on an insulating surface; a gate insulating film; a first crate electrode; a second gate electrode; a first wiring; a second wiring; a first interlayer insulating film; a second interlayer insulating film; an intermediate wiring; and an EL element;

characterized in that:

the gate insulating film is formed over the insulating surface, covering the semiconductor layer;

the first gate electrode and the first wiring are formed contacting the gate insulating film;

the second gate electrode and the second wiring are formed contacting the first gate electrode and the first wiring, respectively the first gate electrode and the first wiring are formed from a first conducting film;

the second gate electrode and the second wiring are formed from a second conducting film;

the first interlayer insulating film is formed covering: the first gate electrode; the second gate electrode; the first wiring; the second wiring; and the gate insulating film;

the second interlayer insulating film is formed over the first interlayer insulating film;

the intermediate wiring is formed covering the second interlayer insulating film, and so as to contact the first interlayer insulating film through a first contact hole formed in the second interlayer insulating film;

the intermediate wiring overlaps with the second wiring through the first interlayer insulating film in the first contact hole;

the semiconductor layer has a channel forming region, LDD regions contacting the channel forming region, and a source region and a drain region contacting the LDD regions;

the LDD regions overlap with the first gate electrode, sandwiching the gate insulating film;

the channel forming region overlaps with the second gate electrode, sandwiching the gate insulating film;

the intermediate wiring is connected to the source region through a second contact hole formed in: the gate insulating film; the first interlayer insulating film; and the second interlayer insulating film;

the EL element has an anode, a cathode, and an EL layer formed between the anode and the cathode; and the drain region is electrically connected to the anode or the cathode.

Another structure of the present invention is a semiconductor display device having: a semiconductor layer formed on an insulating surface; a gate insulating film; a first gate electrode; a second gate electrode; a first wiring; a second wiring; a first interlayer insulating film; a second interlayer insulating film; an intermediate wiring; and a shielding film;

characterized in that:

the gate insulating film is formed on the insulating surface, covering the semiconductor layer;

the first gate electrode and the first wiring are formed contacting the gate insulating film;

the second gate electrode and the second wiring are formed contacting the first gate electrode and the first wiring, respectively;

the first gate electrode and the first wiring are formed from a first conducting film;

the second gate electrode and the second wiring are formed from a second conducting film;

the first interlayer insulating film is formed covering: the first gate electrode; the second gate electrode; the first wiring; the second wiring; and the gate insulating film;

the second interlayer insulating film is formed over the first interlayer insulating film;

the intermediate wiring is formed covering the second in interlayer insulating film, and so as to contact the first interlayer insulating film through a contact hole formed in the second interlayer insulating film;

the intermediate wiring overlaps with the second wiring through the first interlayer insulating film in the contact hole;

the semiconductor layer has a channel forming region, LDD regions contracting the channel forming region and a source region and a drain region contacting the LDD regions;

the LDD regions overlap with the first gate electrode, sandwiching the gate insulating film;

the channel forming region overlaps with the second gate electrodes sandwiching the gate insulating film;

the shielding film is formed from the same conducting film as the intermediate wiring; and the shielding, film is formed on the second interlayer insulating film, and so as to overlap the channel forming region.

Another structure of the present invention is a semiconductor display device having: a semiconductor layer formed on an insulating surface; a gate insulating film; a first gate electrode; a second gate electrode; a first wiring; a second wiring; a first interlayer insulating film; a second interlayer insulating film; an intermediate wiring; a shielding film; and an EL element;

characterized in that:

the gate insulating film is formed on the insulating surface, covering the semiconductor layer;

the first gate electrode and the first wiring are formed contacting the gate insulating film;

the second gate electrode and the second wiring are formed contacting the first gate electrode and the first wiring, respectively;

the first gate electrode and the first wiring are formed from a first conducting film;

the second gate electrode and the second wiring are formed from a second conducting film;

the first interlayer insulating film is formed covering: the first gate electrode; the second gate electrode; the first wiring; the second wiring and the gate insulating film;

the second interlayer insulating film is formed over the first interlayer insulating film;

the intermediate wiring is formed covering the second interlayer insulating film, and so as to contact the first interlayer insulating film through a first contact hole formed in the second interlayer insulating film;

the intermediate wiring overlaps with the second wiring through the first interlayer insulating film in the first contact hole;

the semiconductor layer has a channel forming region, LDD regions contacting the channel forming region, and a source region and a drain region contacting the LDD regions;

the LDD regions overlap with the first gate electrode, sandwiching, the gate insulating film;

the channel forming region overlaps with the second gate electrode, sandwiching the gate insulating film;

the intermediate wiring is connected to the source region through a second contact hole formed in: the gate insulating film; the first interlayer insulating film; and the second interlayer insulating film;

the shielding film is formed from the same conducting film as the intermediate wiring; and the shielding film is formed on the second interlayer insulating film, and so as to overlap the channel forming region;

the EL element has an anode, a cathode and an EL layer formed between the anode and the cathode; and the drain region is electrically connected to the anode or the cathode.

Another structure of the present invention is a semiconductor display device having: a light shielding film formed over a substrate; an insulating film formed over the substrate, covering the light shielding film; a semiconductor layer formed on the insulating film; a gate insulating film contacting the semiconductor layer; a first gate electrode contacting, the gate insulating film; and a second gate electrode contacting, the first gate electrode;

characterized in that:

the semiconductor layer has: a channel forming region; LDD regions contacting the channel forming region; and a source region and a drain region contacting the LDD regions;

the LDD regions overlap with the first gate electrode, sandwiching the gate insulating film;

the channel forming region overlaps with the second gate insulating film, sandwiching the gate insulating film; and the light shielding film overlaps with the channel forming region through the insulating film.

Another structure of the present invention is a semiconductor display device having: a light shielding film formed over a substrate; an insulating film formed over the substrate, covering the light shielding film; a semiconductor layer formed on the insulating film; a gate insulating film contacting the semiconductor layer; a first gate electrode contacting the gate insulating film; a second gate electrode contacting the first gate electrode; and an EL element;

characterized in that:

the semiconductor layer has: a channel forming region; LDD regions contacting the channel forming region; and a source region and a drain region contacting the LDD regions;

the LDD regions overlap with the first gate electrode, sandwiching the gate insulating film;

the channel forming region overlaps with the second gate insulating, film sandwiching the gate insulating film;

the light shielding film overlaps with the channel forming region through the insulating film;

the EL element has an anode, a cathode, and an EL layer formed between the anode and the cathode; and the drain region is electrically connected to the anode or the cathode.

The insulating film in the above structures may also be leveled by CMP polishing with the present invention.

The present invention may also be: a video camera; an image reproduction device; a head mounted display; or a personal computer; in which the semiconductor display device is used.

Another structure of the present invention is a method of manufacturing a semiconductor display device, having the steps of:

forming a semiconductor layer on an insulating surface;

forming a gate insulating film over the insulating surface, covering the semiconductor layer;

forming a first conducting film on the gate insulating film;

forming a second conducting film on the first conducting film;

patterning the first conducting film and the second conducting film, forming a first gate electrode and a second gate electrode;

adding a first impurity to the semiconductor layer from a side where the first gate electrode and the second gate electrode are formed; and forming a mask on the semiconductor layer, covering the first gate electrode and the second gate electrode; and forming a channel forming region, first LDD regions contacting the channel forming region, second LDD regions contacting the first LDD regions, and a source region and a drain region contacting the second LDD regions by adding a second impurity having the same type of conductivity as that of the first impurity from a side where the mask is formed on the semiconductor layer;

characterized in that:

the first gate electrode is longer than the second gate electrode in a channel longitudinal direction;

the channel forming region overlaps with the second gate electrode, sandwiching the gate insulating film; and the first LDD regions overlap with the first gate electrode, sandwiching the gate insulating film.

Another structure of the present invention is a method of manufacturing a semiconductor display device, having the steps of:

forming a semiconductor layer on an insulating surface;

forming a gate insulating film over the insulating surface, covering the semiconductor layer;

forming a first conducting film on the gate insulating film;

forming a second conducting film on the first conducting film;

patterning the first conducting film and the second conducting film, forming a first gate electrode and a second gate electrode;

adding a first impurity to the semiconductor layer from a side where the first gate electrode and the second gate electrode of the semiconductor layer are formed; and forming a mask on the semiconductor layer, covering the first gate electrode and the second gate electrode; and forming a channel forming region, first LDD regions contacting the chancel forming region, second LDD regions contacting the first LDD regions, and a source region and a drain region contacting the second LDD regions by adding a second impurity having the same type of conductivity as that of the first impurity from a side where the mask is formed on the semiconductor layer;

characterized in that:

the first gate electrode is longer than the second gate electrode in a channel longitudinal direction;

the channel forming region overlaps with the second gate electrode sandwiching the gate insulating film; and the first LDD regions overlap with the first gate electrode, sandwiching, the gate insulating film.

Another structure of the present invention is a method of manufacturing a semiconductor display device, having the steps or:

forming a semiconductor layer on an insulating surface;

forming a gate insulating film over the insulating surface, contacting the semiconductor layer;

forming a first gate electrode and a first shape second gate electrode contacting the gate insulating film;

etching the first gate electrode and the first shape second gate electrode, forming a first gate electrode having a tapered portion and a second shape second gate electrode;

adding an impurity element which imparts one conductivity type through the gate insulating film and into the semiconductor layer, forming second LDD regions; and at the same time adding an impurity element which imparts one conductivity type through the tapered portion of the first gate electrode and into the semiconductor layer, forming first LDD regions in which the impurity concentration increases toward an edge portion of the semiconductor layer; and adding an impurity element which imparts a one conductivity type with the first gate electrode having the tapered portion and the second shape second gate electrode as masks, forming a source region or a drain region.

BRIEF DESCRIPTION OF THE DRAWINGS

FIGS. 4A to 4C are diagrams showing the process of manufacturing the EL display device of Embodiment 1;

FIG. 9 is a cross sectional diagram of an EL display device of Embodiment 5;

DETAILED DESCRIPTION OF THE PREFERRED EMBODIMENTS

Embodiment Mode

Figure 1A:
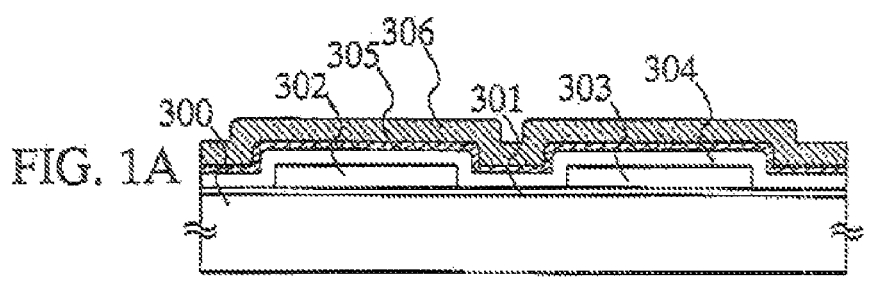
FIGS. 1A to 1F are diagrams showing a process of manufacturing an EL display device of the present invention.

A thin film transistor of the present invention, and a method of manufacturing the thin film transistor are shown in FIGS. 1A to 1F.

A base film 301 is formed on a substrate 300. The base film 301 need not be formed, but the formation of the base film 301 is effective in preventing impurity diffusion from the substrate 300 into semiconductor layers. Semiconductor layers 302 and 303 are formed on the base film 301 from a crystalline semiconductor film manufactured by a known method.

A gate insulating film 304 is formed covering the semiconductor layers 302 and 303. A first conducting film 305 and a second conducting film 306 are then formed on the gate insulating film 304 in order to form gate electrodes. Note that it is necessary for the first conducting film 305 and the second conducting film 306 to be conducting materials which have etching selectivity. (See FIG. 1A.)

Resist masks 307 and 308 are formed next on the semiconductor layers 302 and 303. First shape conducting layers 309 and 310 (first conducting layers 309a and 310a, and second conducting layers 309b and 310b) are then formed by etching (a first etching process) the first conducting layer 305 and the second conducting layer 306 using the masks 307 and 308. (See FIG. 1B.)

Figure 1B:
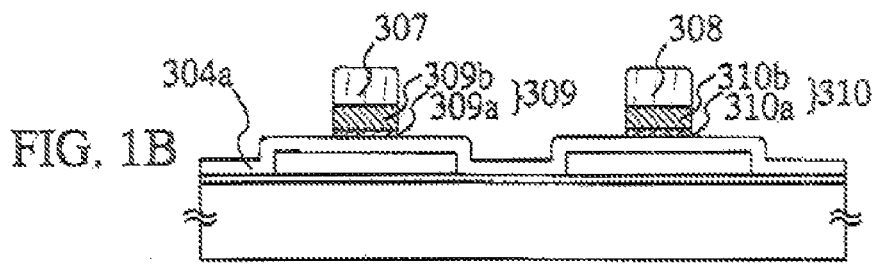
Figure 2A:
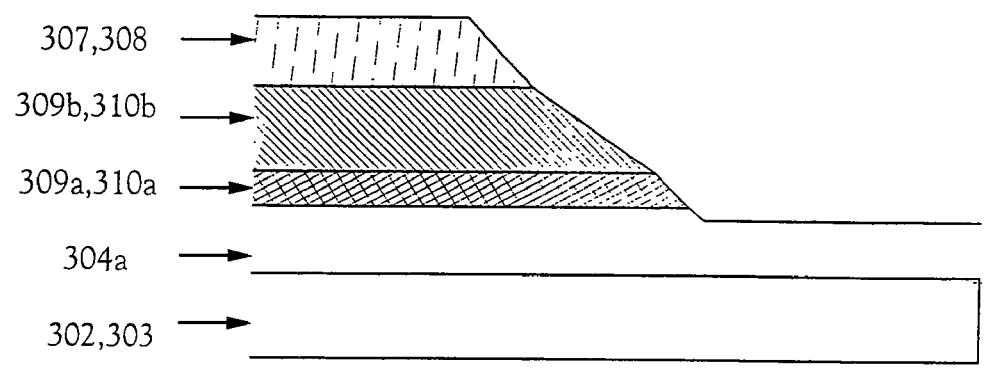
FIGS. 2A and 2B are enlarged diagrams of a TFT gate electrode of the present invention.

An enlarged diagram of the first shape conducting, layers 309 and 310 of FIG. 1B is shown in FIG. 2A. Edge portions of the first conducting layers 309a and 310a, and edge portions of the second conducting layers 309b and 310b become tapered as shown in FIG. 2A. Further, the gate insulating film 304 is etched and becomes thinner in regions not covered by the first shape conducting layers 309 and 310, becoming a first shape gate insulating film 304a.

Figure 1C:
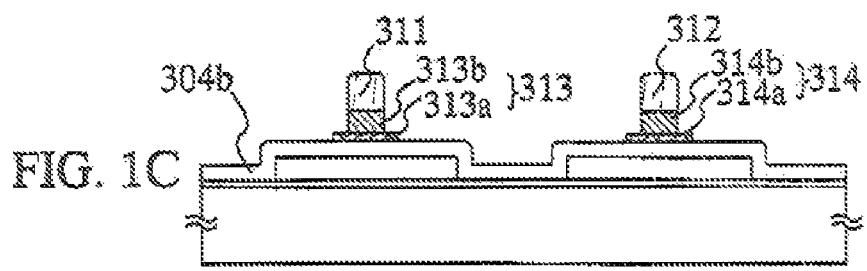

A second etching process is performed next as shown in FIG. 1C. The first shape second conducting layers 309b and 310b are anisotropically etched, and the first conducting layers 309a and 310a are anisotropically etched at a slower etching speed than that of the second conducting layers 309b and 310b, forming, second shape conducting layers 313 and 314 (first conducting layers 313a and 314a, and second conducting layers 313b and 314b).

Figure 2B:
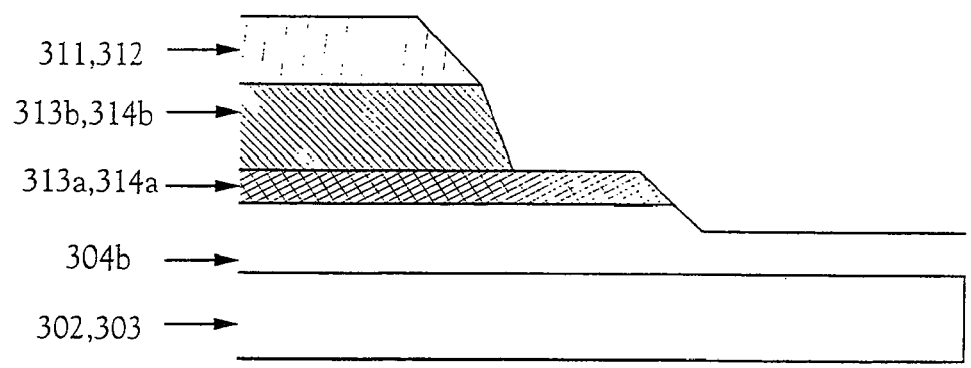

An enlarged diagram of the second shape conducting layers 313 and 314 of FIG. 1C is shown in FIG. 2B here. The second conducting layers 313b and 314b are etched more than the first conducting layers 313a and 314a by the second etching process, as shown in FIG. 2B. Further, the masks 307 and 308 are etched by the second etching process, becoming masks 311 and 312. The first shape gate insulating film 304a is further etched and becomes thinner in regions not covered by the second shape conducting layers 311 and 314, becoming a second shape gate insulating film 304b.

Figure 1D:
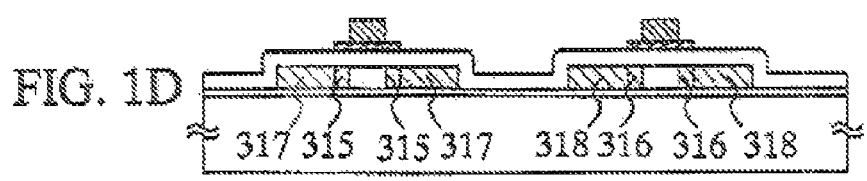
Figure 1E:
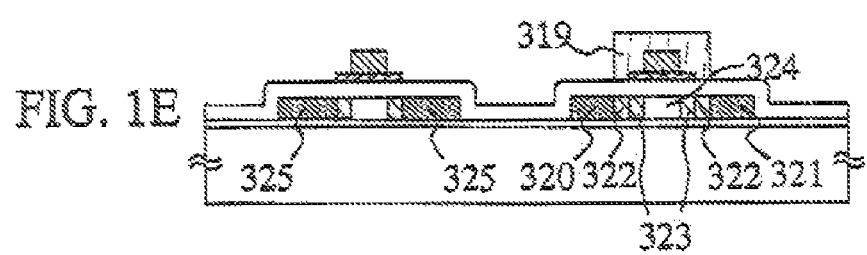

The masks 311 and 312 are removed, and a first doping process is performed on the semiconductor layers 302 and 303, as shown in FIG. 1D, adding an impurity element which imparts n-type conductivity. Doping is performed using the second shape conducting layers 313 and 314 as masks against the impurity element. Doping is performed so as to also add the impurity element in regions under the second shape conducting layers 313a and 314a.

First impurity regions 315 and 316, which overlap with the second conducting layers 313a and 314a, and second impurity regions 317 and 318, which have a higher impurity concentration than the first impurity regions, are formed. Note that, although the impurity element which imparts n-type conductivity is added after removing the masks 311 and 312 in this embodiment mode, the present invention is not limited by this. The masks 311 and 312 may also be removed after adding the impurity element which imparts n-type conductivity in the process of FIG. 1D.

A mask 319 is then formed from resist on the semiconductor layer 303 so as to cover the second shape conducting layer 314. The mask 319 overlaps with a portion of the second impurity region 318, sandwiching the second shape gate insulating film 304b. A second doping process is then performed, adding an impurity, element which imparts n-type conductivity. Doping of the n-type conductivity imparting impurity element is performed at conditions in which the dosage is increased more than that of the first doping process, and in which the acceleration voltage is low. In addition to a channel forming region 324 and an Lov region 323, a source region 320, a drain region 321, and an Loff region 322 are formed in the semiconductor layer 303 in a self-aligning manner by the second doping process. Further, a third impurity region 325 is formed in the semiconductor layer 302 by the second doping process with the second shape first conducting layer 313a as a mask. (See FIG. 1E.)

It is possible to freely set the size of the Loff region 322 by controlling the size of the mask 319 in the present invention.

Figure 1F:
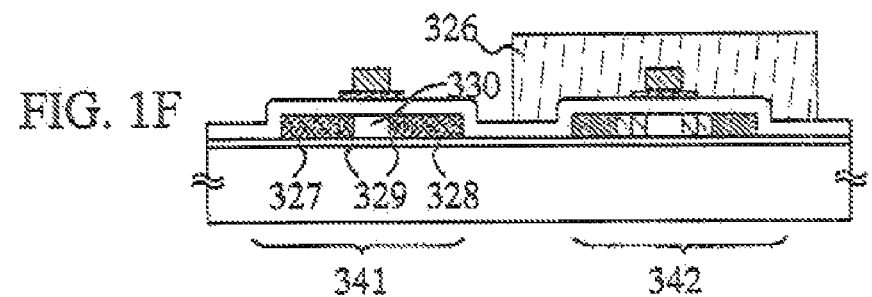

The entire surface of the semiconductor layer 303, which forms an n-channel TFT, is then covered by a resist mask 326 as shown in FIG. 1F. A source region 327, a drain region 328, and an Lov region 329, into which an impurity element which imparts p-type conductivity is added in accordance with a third doping process using the second shape conducting layer 313 as a mask against the impurity element; and a channel forming region 330 are then formed in a self-aligning manner in the p-channel TFT forming semiconductor layer 302.

The n-type conductivity imparting impurity element is already added to the source region 327, the drain region 328, and the Lov region 329 at differing concentrations, but the conductivity type of the source region 327, the drain region 328, and the Lov region 329 is set to p-type by adding the p-type conductivity imparting impurity element at a concentration which is sufficiently higher than the concentration of the impurity element which imparts n-type conductivity.

The impurity regions (source regions, drain regions, Lov regions, and Loff regions) are thus formed in the semiconductor layers 302 and 303 by the above processes. The second shape conducting layers 313 and 314 overlapping with the semiconductor layers 302 and 303 function as gate electrodes. The second shape first conducting layers 313a and 314a are referred to as a first gate electrode, and the second shape second conducting layers 313b and 314b are referred to as a second sate electrode.

A process of activating the impurity elements, added to the respective semiconductor layers is performed next with a goal of controlling conductivity. However, it is preferable to perform activation after forming an interlayer insulating film (having silicon as its main constituent) in order to protect portions such as wirings if the conducting material used in the first conducting film 305 and the second conducting film 306 is weak with respect to heat. The activation can be carried out by irradiating with a laser light or an infrared light.

In addition, heat treatment is performed in an atmosphere containing between 3 and 100% hydrogen, performing hydrogenation of the semiconductor layers 302 and 303. This process is one of terminating dangling bonds in the semiconductor layers by hydrogen which is thermally activated. Plasma hydrogenation (using hydrogen which is thermally activated by a plasma) may also be performed as another means of hydrogenation.

A p-channel TFT 341 and an n-channel TFT 342 are completed when the above processes are finished.

Note that, although the surfaces are shown in the figures to be level in FIGS. 1A to 1F, and 2A and 2B, for regions in which the lengths of the second shape first gate electrodes 313a and 314a are longer compared to the lengths of the second gate electrode 313b and 314b in the channel longitudinal direction, actually a taper having an extremely small taper angle exists. Note also that it is also possible to make this level, depending upon the etching conditions.

The length in the channel longitudinal direction (the direction in which a carrier moves) of the first gate electrode and the second gate electrode (hereafter referred to simply as gate electrode width) thus differs with the present invention, as stated above. In accordance with performing ion injection with the first rate electrode and the second gate electrode as masks, the difference in ion penetration depth due to the differing thicknesses of the gate electrodes is utilized, and it therefore becomes possible to make the ion concentration within the semiconductor layers which are arranged under the second gate electrode lower than the ion concentration of the semiconductor layers arranged under the first gate electrode without arranging them under the second gate electrode. In addition, it is possible to make the ion concentration within the semiconductor layers arranged under the first gate electrode without positioning them under the second gate electrode lower than the ion concentration of the semiconductor layers which are not arranged under the first gate electrode.

Further, in order to form the Loff region using a mask, only the width of the first gate electrode and the width of the second gate electrode must be controlled by etching, and therefore control of the position of the Loff region and the Lov region becomes easy compared to the conventional examples. Precise positional alignment of the Lov region and the Loff region therefore becomes easy, and it also becomes easy to manufacture TFTs having desired characteristics.

Note that the above stated structure of the present invention is not limited to an EL display device, and it is also possible to use the above structure in a liquid crystal display device.

Embodiments of the present invention are explained below.

Embodiment 1

A method of manufacturing a pixel portion, and TFTs (n-channel TFTs and p-channel TFTs) of a driver circuit formed in the periphery of the pixel portion, at the same time and on the same substrate is explained in detail in Embodiment 1. Note that, in this specification, driver circuit includes a source signal line driver circuit and a gate signal line driver circuit. In addition, the TFTs of the driver circuit are referred to as driver circuit TFTs in this specification.

Figure 3A:
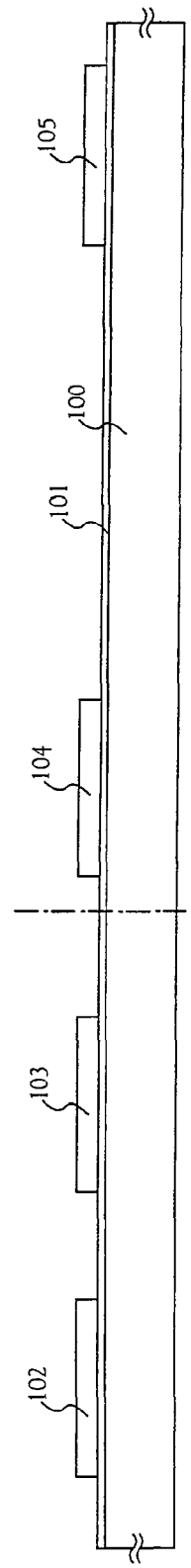
FIGS. 3A to 3D are diagrams showing a process of manufacturing an EL display device of Embodiment 1.

First, as shown in FIG. 3A, a base film 101 made from an insulating film such as a silicon oxide film, a silicon nitride film, or a silicon nitride oxide film is formed on a substrate 100 made from glass or made from quartz substrate, such as barium borosilicate glass or aluminum borosilicate glass, typically Corning Corp. #7059 glass or #1737 glass. For example, a silicon nitride oxide film manufactured from $SiH_4$, $NH_3$, and $N_2O$ by plasma CVD is formed with a thickness of 10 to 200 nm (preferably from 50 to 100 nm), and a hydrogenized silicon nitride oxide film with a thickness of 50 to 200 nm (preferably between 100 and 150 nm), manufactured from $SiH_4$ and $N_2O$, is similarly formed and laminated. Note that this is shown as one layer in FIG. 3A. The base film 101 is shown as a two layer structure in Embodiment 1, but it may also be formed as a single layer of one of the above insulating films, and it may also be formed having a lamination structure in which at least two layers are laminated.

Semiconductor layers 102 to 105 are formed by a crystalline semiconductor film manufactured using a laser crystallization method of a semiconductor film having an amorphous structure, or using a known thermal crystallization method. The thickness of the semiconductor layers 102 to 105 is formed from 25 to 80 nm thick (preferably between 30 and 60 nm). There are no limitations on the crystalline semiconductor film material, but it is preferable to form the film from a semiconductor material such as silicon or a silicon germanium (SiGe) alloy.

As for know crystallization methods, there is a thermal crystallization method using an electric furnace, a laser annealing crystallization method using laser light, a lamp annealing crystallization method using infrared light, and a crystallization method using a catalyst metal.

A laser such as a pulse emission type or continuous emission type excimer laser, a YAG laser, and a $YVO_4$ laser can be used as a laser light source used in the laser crystallization method to manufacture a crystalline semiconductor film. A method of condensing laser light emitted from a laser emission de-ice into a linear shape by an optical system and then irradiating the light to the semiconductor film may be used when these types of lasers are used. The crystallization conditions ma, be suitably selected by the operator, but when using the excimer laser, the pulse emission frequency is set to 30 Hz, and the laser energy density is set from 100 to 400 $mJ/cm^2$ (typically between 200 and 300 $mJ/cm^2$). Further, the second harmonic is utilized when using the YAG laser, the pulse emission frequency is set from 1 to 10 KHz, and the laser energy density may be set from 300 to 600 $mJ/cm^2$ (typically between 350 and 500 $mJ/cm^2$). The laser light collected into a linear shape with a width of 100 to 1000 µm for example 400 µm, is then irradiated over the entire surface of the substrate. This is performed with an overlap ratio of 80 to 98% for the linear shape laser light.

A gate insulating film 106 is formed covering the island shape semiconductor layers 102 to 105. A gate insulating film is formed by an insulating film containing silicon with a thickness of 40 to 150 nm by plasma CVD or sputtering. A 120 nm thick silicon nitride oxide film is formed in Embodiment 1. The gate insulating film is not limited to this type of silicon nitride oxide film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHZ) electric power density of 0.5 to 0.8 $W/cm^2$. Good characteristics as a gate insulating film can be obtained by subsequently performing thermal annealing, at between 400 and 500° C., of the silicon oxide film thus manufactured.

A first conducting film 107 and a second conducting film 108 are then formed on the gate insulating film 106 in order to form gate electrodes. The first conducting film 107 is formed from Ta (tantalum) with a thickness of 50 to 100 nm, and the second conducting film 108 is formed by W (tungsten) having a thickness of 00 to 300 nm ii, in Embodiment 1.

The Ta film is formed by sputtering, and sputtering of a Ta target is performed by Ar. If appropriate amounts of Xe and Kr are added to Ar at the time of sputtering, the internal stress of the formed film is relaxed, and film peeling can be prevented. The resistivity of an α phase Ta film is on the order of 20 µΩm, and it can be used in the gate electrode, but the resistivity of a β phase Ta film is on the order of 180 µΩcm and it is unsuitable for the gate electrode. An α phase Ta film can easily be obtained if a tantalum nitride film, which possesses a crystal structure near that of α phase Ta, is formed with a thickness of 10 to 50 nm as a base for Ta in order to form α phase Ta.

W is formed by sputtering with a W target in cases of forming a W film, which can also be formed by thermal CVD using tungsten hexafluoride ($WF_o$). Whichever is used it is necessary to be able to make the film become low resistance in order to use it as the gate electrode, and it is preferable that the resistivity of the W film be made equal to or less than 20 µΩcm. The resistivity can be lowered by enlarging the crystals of the W film, but for cases in which there are many impurity elements such as oxygen within the W film, crystallization is inhibited, and the film becomes high resistance. A W target having a purity of 99.9999% or 99.99% is thus used in sputtering. In addition, by forming the W film while taking sufficient care that no impurities from within the gas phase are introduced at the time of film formation, a resistivity of 9 to 20 µΩcm can be achieved.

Note that, although the first conducting film 107 is Ta and the second conducting film 108 is W in Embodiment 1, the conducting films are not limited to these, and both may also be formed from an element selected from the group consisting of Ta, W, Ti, Mo, Al, and Cu, or from an alloy material having one of these elements as its main constituent, or from a chemical compound of these elements. Further, a semiconductor film, typically a polysilicon film into which an impurity element such as phosphorous is doped, may also be used. Examples of preferable combinations other than that used in Embodiment 1 include: forming the first conducting film by tantalum nitride (TaN) and combining it with the second conducting film formed from W; forming the first conducting film by tantalum nitride (TaN) and combining it with the second conducting film formed from Al; and forming the first conducting film by tantalum nitride (TaN) and combining it with the second conducting film formed from Cu. (See FIG. 3B.)

Masks 109 to 113 are formed next from resist, and a first etching process is performed in order to form electrodes and wirings. An ICP (inductively coupled plasma) etching method is used in Embodiment 1. A gas mixture of $CF_4$ and $Cl_2$ is used as an etching gas, and a plasma is generated by applying a 500 W RF electric power (13.56 MHz) to a coil shape electrode at a pressure of 1 Pa. A 100 W RF electric power (13.56 MHz) is also applied to the substrate side (test piece stage), effectively applying a negative self-bias voltage. The W film and the Ta film are both etched on the same order when $CF_4$ and $Cl_2$ are combined.

Figure 3B:
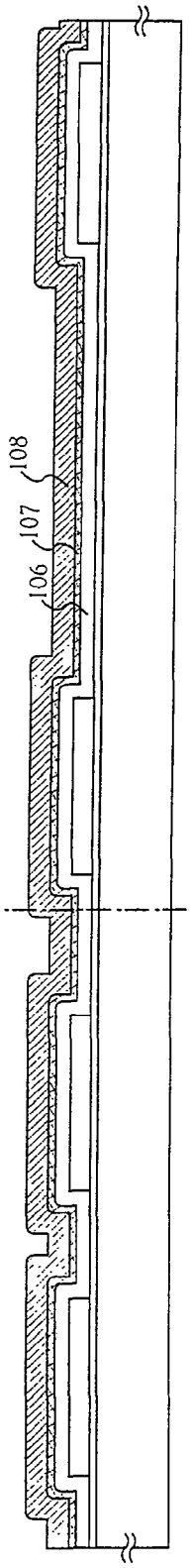
Figure 3C:
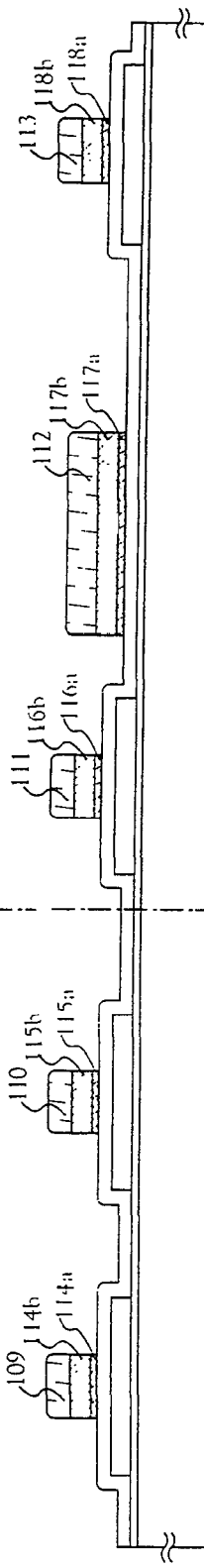

Not shown in FIG. 3C, edge portions of the first conducting layer and the second conducting layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon nitride oxide film with respect to a W film is from 2 to 4 (typically 3), and therefore approximately 20 to 50 nm of the exposed surface of the silicon nitride film is etched by this over-etching process. Further, not shown in FIG. 3C, regions of the gate insulating film 106 not covered by first shape conducting layers 114 to 118 are made thinner by 20 to 50 nm.

The first shape conducting layers 114 to 118 (first conducting layers 114a to 118a and second conducting layers 114b to 118b) are thus formed from the first conducting layer and the second conducting layer in accordance with the first etching process.

Figure 3D:
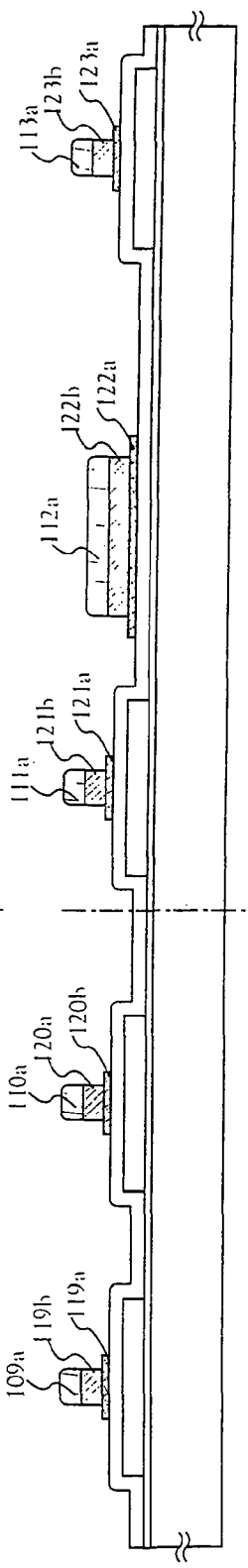

A second etching process is performed next, as shown in FIG. 3D. The ICP etching method is similarly used, a mixture of $CF_4$, $Cl_2$, and $O_2$ is used as the etching gas, and a plasma is generated by supplying a 500 W RF electric power (13.56 MHz) to a coil shape electrode at a pressure of 1 Pa. A 500 W RF (13.56 MHz) electric power is applied to the substrate side (test stage), and a self-bias voltage which is lower in comparison to that of the first etching process is applied. The W film is etched anisotropically under these etching conditions, and Ta (the first conducting layers) is anisotropically etched at a slower etching speed, forming second shape conducting layers 119 to 123 (first conducting layers 119a to 123a and second conducting layers 119b to 123b). Further, although not shown in FIG. 3D, the gate insulating film 106 is additionally etched on the order of 20 to 50 nm, becoming thinner, in regions not covered by the second shape conducting, layers 119 to 123. The masks 109 to 113 are etched by the second etching process, becoming masks 109a to 113a.

The etching reaction of the W film and the Ta film in accordance with the mixed gas of $CF_4$ and $Cl_2$ can be estimated from the radicals generated, and from the ion types and vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions are generated. As a result, the etching speed of the W film having a high fluoride vapor pressure becomes high. On the other hand, even if F increases, the etching speed of Ta does not relatively increase. Further, Ta easily oxidizes compared to W, and therefore the surface of Ta is oxidized by the addition of $O_2$. The etching speed of the Ta film is further reduced because Ta oxides do not react with fluorine and chlorine. It therefore becomes possible to have a difference in etching speeds between the W film and the Ta film, and it becomes possible to make the etching speed of the W film larger than that of the Ta film.

The masks 109a to 113a are removed, and a first doping process is performed as shown in FIG. 4A, adding an impurity element which imparts n-type conductivity. For example, doping may be performed at an acceleration voltage of 70 to 120 keV and with a dosage of $1\times10^{13}$ atoms/$cm^2$. The doping process is performed using the second shape conducting layers 119 to 123 as masks against the impurity element, and so as to also add the impurity element in regions below the second conducting layers 119a to 123a. First impurity regions 125 to 128, which overlap with the second conducting layers 119a to 123a, and second impurity regions 129 to 132, which have a higher impurity concentration than the first impurity regions, are thus formed. Note that the n-type conductivity imparting element is added after removing, the masks 109a to 113a in Embodiment 1, but the present invention is not limited to this. The impurity element which imparts n-type conductivity may also be added in the step of FIG. 4A, and then the masks 109a to 113a may be removed.

A mask 133 is next formed on the semiconductor layer 104 so as to cover the second conducting layers 121a and 121b. A portion or the mask 133 overlaps with the second impurity region 131, sandwiching the gate insulating film 106. A second doping process is then performed, and an impurity element which imparts n-type conductivity is added. Doping of the n-type conductivity imparting impurity element is performed at conditions in which the dosage is raised higher than that of the first doping process, and at a low acceleration voltage. (See FIG. 4B.) The doping can be carried out by ion doping or ion implantation. Ion doping is performed under conditions of a dose amount from $1\times10^{13}$ to $5\times10^{14}$ atoms/$cm^2$ and an acceleration voltage of 60 to 100 keV. A periodic table group 15 element, typically phosphorous (P) or arsenic (As) is used as the impurity element which imparts n-type conductivity, and phosphorous (P) is used here. The conducting layers 119 to 123 become masks with respect to the n-type conductivity imparting impurity element in this case, and source regions 134 to 137, drain regions 138 to 141, and Lov regions 142 to 145 are formed in a self-aligning manner. Further, Loff region 146 is formed in accordance with the mask 133. The impurity element which imparts n-type conductivity is added to the source regions 134 to 137, and to the drain regions 13S to 141 with a concentration in the range of $1\times10^{22}$ to $1\times10^{21}$ atoms/$cm^3$.

It is possible to freely set the length of the Loff region 146 in the direction which the carrier moves by controlling the size of the mask 133 with the present invention.

The n-type conductivity imparting impurity element is added so as to form a concentration of $1\times10^{17}$ to $1\times10^{19}$ atoms/$cm^3$ in the Loft region, and a concentration of $1\times10^{16}$ to $1\times10^{15}$ atoms/$cm^3$ in the Lov region.

Source regions 147 and 148, drain regions 149 and 150, and Lov regions 111 and 152, into which an impurity element having a conductivity type which is the inverse of the above one conductivity type, are then formed in the p-channel TFT forming semiconductor layers 102 and 105, as shown in FIG. 4C. The second shape second conducting layers 119b and 123b are used as a mask with respect to the impurity element, and the impurity regions are formed in a self-aligning manner. The island shape semiconductor layers 102 and 103, which form n-channel TFTs, are covered over their entire surface areas by a resist masks 153 at this point. Phosphorous is already added in differing concentration to the source regions 147 and 148, the drain regions 149 and 150, and the Lov regions 151 and 152, and ion doping is performed here using diborane ($B_2H_6$), so that boron is also added to each of the regions with a concentration of $2\times10^{20}$ to $2\times10^{21}$ atoms/$cm^3$. In practice, the boron contained in the source regions 147 and 148, the drain regions 149 and 150, and the Lov regions 151 and 152 is influenced by the film thickness of the conducting layers and the insulating film, which have a tapered shape in cross section at their edge portions above the semiconductor layers, similar to the second doping process. The concentration of the impurity element added into also changes.

Impurity regions (source regions, drain regions, Lov regions, and Loff regions) are formed in the respective island shape semiconductor layers by the above processes. The second shape conducting layers 119 to 121 and 123 overlapping the island shape semiconductor layers function as gate electrodes. Further, the second shape conducing layer 122 functions as a capacitor wiring.

A process of activating the impurity elements added to the respective island shape semiconductor layers is then performed, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen environment at 400 to 700° C., typically between 500 and 600° C. Heat treatment is performed for 4 hours at 550° C. in Embodiment 1. However, for cases in which the wiring material used in the conducting layers 119 to 123 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

A first interlayer insulating film 155 is formed next from a silicon nitride oxide film having a thickness of 100 to 200 nm. A second interlayer insulating film 156 made from an organic insulating material is then formed on the first interlayer insulating film 155.

Figure 5A:
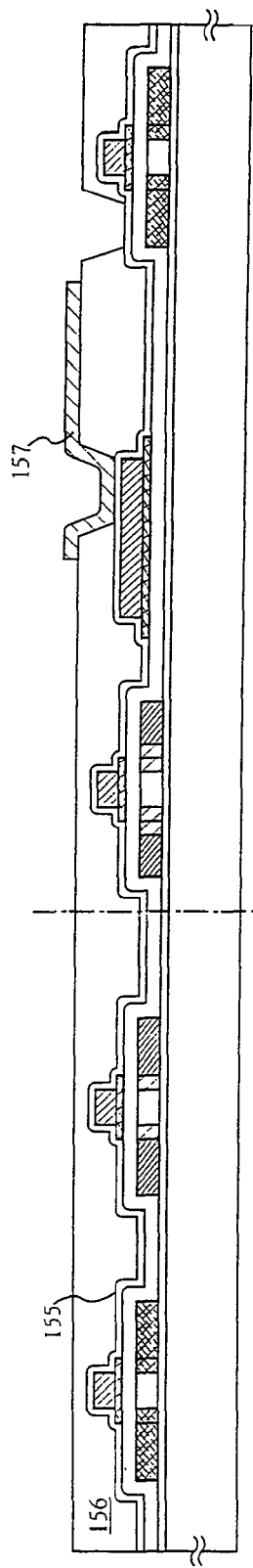
FIGS. 5A to 5C are diagrams showing the process of manufacturing the EL display device of Embodiment 1.

Contact holes are then formed in the second interlayer insulating film 156 over the capacitor wiring 122 and over the source region 148 to expose a portion of the first interlayer insulating film. An intermediate wiring (electric power source supply line) 157 is the formed so as to contact the first interlayer insulating film 15D through the contact hole above the capacitor wiring 122. (See FIG. 5A.)

Next, a third interlayer insulating film 158 made from an organic insulating material is formed on the second interlayer insulating film 156.

Figure 5B:
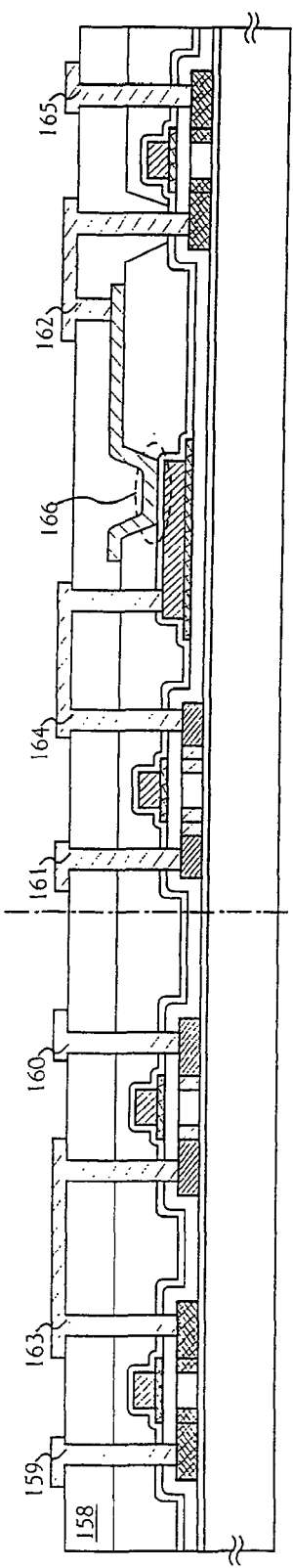

Contact holes are then formed in the gate insulating film 106, the first interlayer insulating film 155, and the second interlayer insulating film 156, and source wirings 159 to 162 are formed so as to contact the source regions 147, 135, 136, and 148 through the contact holes. Further, drain wirings 163 to 165 are formed similarly contacting the drain regions 149, 139, 140, and 150. (See FIG. 5B.) The drain region 140 and the capacitor wiring 122 are electrically connected by the drain wiring 164. Further, the electric power source supply line (intermediate wiring) 157 and the source region 148 are electrically connected by the source wiring 162.

Note that it is preferable to form the contact holes by dry etching using $CF_4$ and $O_2$ when the gate insulating film 106, the first interlayer insulating film 155, and the second interlayer insulating film 156 are $SiO_2$ films or SiON films. Further, for cases in which the gate insulating film 156, the first interlayer insulating film 155, and the second interlayer insulating film 156 are organic resin films, it is preferable to form the contact holes by dry etching using $CHF_4$ or by BHF (buffered hydrogen fluoride, $HF+NH_4F$). In addition, if the gate insulating film 106, the first interlayer insulating film 155 and the second interlayer insulating film 156 are formed by different materials, it is preferable to change the method of etching and the etchant or etching gas tape for each film. The contact holes may also be formed by using the same etching method and the same etchant or etching gas.

A storage capacitor 166 is formed in portions at which the first interlayer insulating film 155 is formed contacting and between the capacitor wiring 122 and the electric power source supply line 157.

A fourth interlayer insulating film 167 is formed next formed an organic resin. Organic resins such as polyimide, polyamide, acrylic, and BCB (benzo)cyclobutene) can be used. In particular, it is preferable to use acrylic, which has superior levelness, because the fourth interlayer insulating film 167 is formed with a strong implication of leveling. An acrylic film is formed in Embodiment 1 at a film thickness at which steps formed by the TFTs can be sufficiently leveled. The film thickness is preferably from 1 to 5 μm (more preferably between 2 and 4 μm).

Figure 5C:
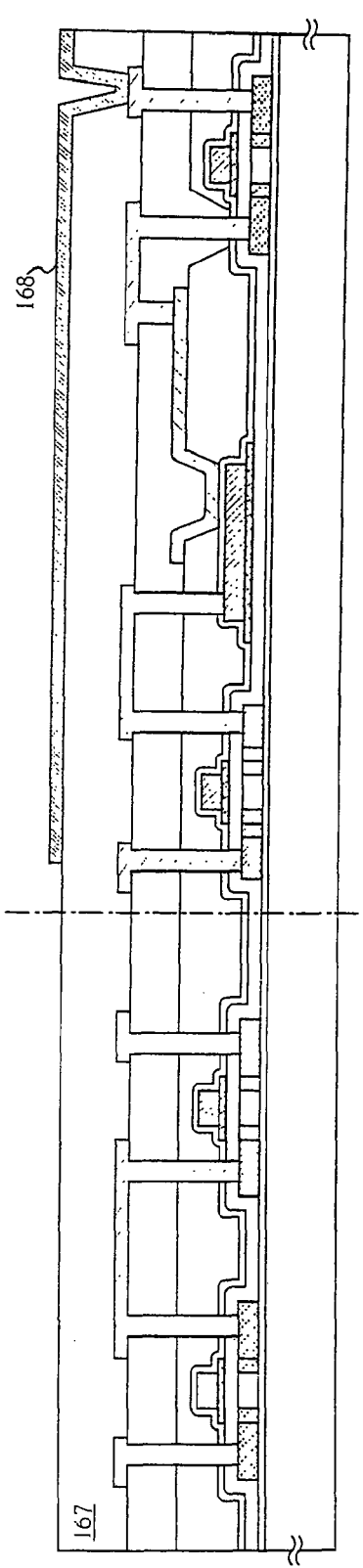

A contact hole for reaching the drain wiring 165 is formed next in the fourth interlayer insulating film 167, and a pixel electrode 168 is formed. An indium oxide tin oxide (ITO) film is formed with a thickness of 110 nm in Embodiment 1, and patterning is then performed, forming the pixel electrode 168. Further, a transparent conducting film in which between 2 and 20% zinc oxide (ZnO) is mixed with indium oxide may also be used. The pixel electrode 168 becomes an anode of an EL element. (See FIG. 5C.)

Figure 6A:
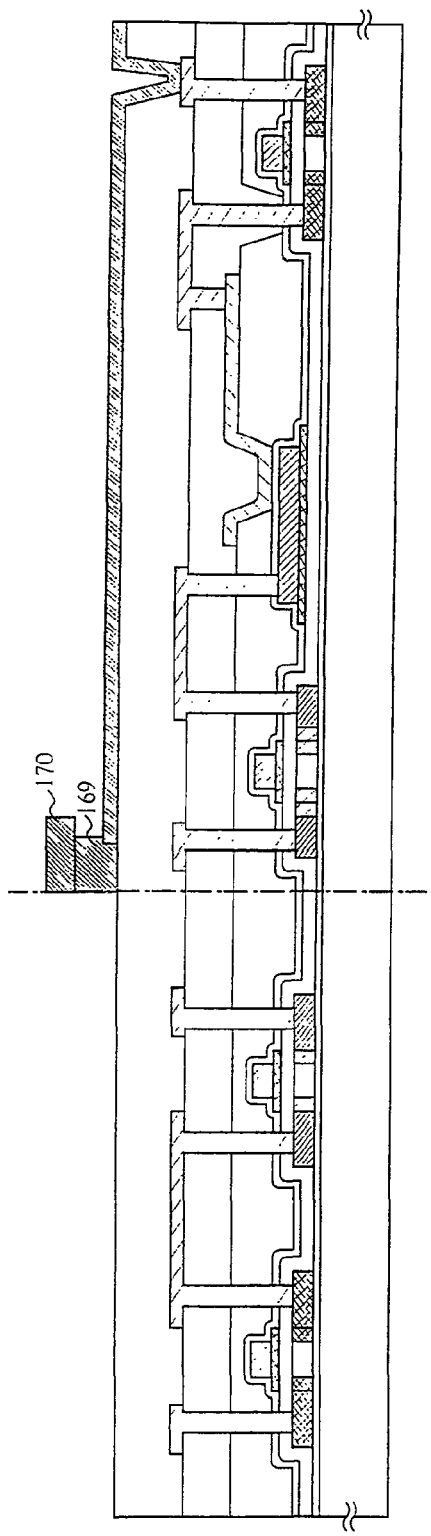
FIGS. 6A and 6B are diagrams showing the process of manufacturing the EL display device of Embodiment 1.

A first bank 169 and a second bank 170 are formed next from a resin material. The first bank 169 and the second bank 170 are formed in order to separate EL layers and cathodes, formed later, of adjacent pixels. It is therefore preferable that the second bank 170 stick out farther horizontally than the first bank 169. Note that it is preferable that the combined thickness of the first bank 169 and the second bank 170 be made on the order of 1 to 2 μm, but there are no limitations on this thickness provided that the EL layers and the cathodes formed later of adjacent pixels can be separated. Further, it is necessary to form the first bank 169 and the second bank 170 by an insulating film, and it is therefore possible to use materials such as an oxide or a resin, for example. The first bank 169 and the second bank 170 may both be formed by the same material, and the may also be formed by different materials. The first bank 169 and the second bank 110 are formed in stripe shapes between pixels. The first bank 169 and the second bank 170 may be formed on and along the source wirings (source signal lines), and may be formed on and along the gate wirings (gate signal lines). Note that the first bank 169 and the second bank 170 may also be formed by a material in which a pigment is mixed into a resin. (See FIG. 6A.)

An EL layer 171 and a cathode (MgAg electrode) 172 are formed next in succession without exposure to the atmosphere using vacuum evaporation. Note that the film thickness of the EL layer 171 may be from 80 to 20 nm (typically between 100 and a 1-0 nm), and that the film thickness of the cathode 172 may be from 180 to 300 nm (typically between 200 and 250 nm). Note also that, although only one pixel is shown in Embodiment 1, an EL layer which emits red color light, an EL layer which emits green color light, and an EL layer which emits blue color light are formed at the same time at this point.

The EL layers 171 are formed in order for a pixel corresponding to the color red, a pixel corresponding to the color green, and a pixel corresponding to the color blue. However, the EL layers 171 have scant resistance with respect to solutions, and therefore each color must be formed separately without using a photolithography technique. It is preferable to use a metal mask and cover the pixels other than the desired pixel, and selectively form the EL layers 171 in only the required locations.

Namely, first a mask is set so as to cover all of the pixels except for those corresponding to the color red, and red color light-emitting EL layers are selectively formed using the mask. Next, a mask is set so as to cover all of the pixels except for those corresponding to the color green, and green color light-emitting EL layers are selectively formed using the mask. Finally, a mask is set so as to cover all of the pixels except for those corresponding to the color blue, and blue color light-emitting EL layers are selectively formed using the mask. Note that, although the use of all different masks is recorded here, the same mask may also be reused. Further, it is preferable to perform processing until all pixel EL layers are formed without releasing the vacuum.

Note that a single layer structure composed of only a light-emitting layer is shown in Embodiment 1 for the EL layer 171, but a structure having layers such as a hole transporting layer, a hole injecting layer, an electron transporting layer, and an electron injecting layer in addition to the light-emitting layer may also be used for the EL layer. Various examples of these types of combinations have already been reported, and all such structures may be used. A known material can be used as the EL layer 171. Considering the EL driver voltage, it is preferable to use an organic material as the known material.

The cathode 172 of the EL element is formed next. An example of using an MgAg electrode as the cathode 172 is shown in Embodiment 1, but it is also possible to use other known materials.

Figure 6B:
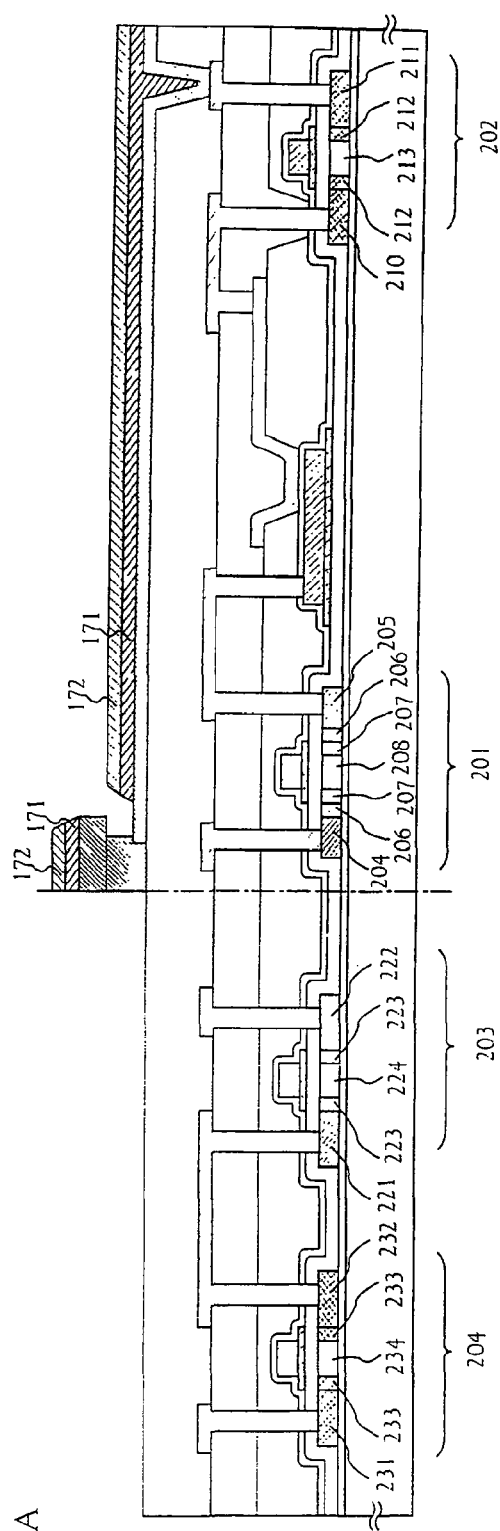

An EL panel having a structure as shown in FIG. 6B is thus completed. Note that, after forming the first bank 169 and the second bank 170, it is effective to perform processing in succession without exposure to the atmosphere up through to the formation of the cathode 172 by using a multi-chamber method (or an in-line method) thin film formation apparatus.

In Embodiment 1, a source region 204, a drain region 205, an Loff region 206, an Lov region 207, and a channel forming region 208 are contained in a semiconductor layer of a switching TFT 201. The Loff region 206 is formed so as not to overlap with the gate electrode 116 through the gate insulating film 106. Further, the Lov region 207 is formed so as to overlap with the gate electrode 121 through the gate insulating film 106. This type of structure is extremely effective in reducing the off current.

Further, a single gate structure is used as the switching TFT 201 in Embodiment 1, but the present invention may also have a double gate structure or another type of multi-gate structure for the switching TFT. Two TFTs are effectively connected in series by using the double gate structure, giving the advantage of additionally reducing the off current.

Further, the switching TFT 201 is an n-channel TFT in Embodiment 1, but a p-channel TFT may also be used.

A semiconductor layer of an electric current control TFT 202 contains a source region 210, a drain region 211, an Lov region 212, and a channel forming region 213. The Lov region 212 is formed so as to overlap with the gate electrode 123 through the gate insulating film 106. Note that the electric current control TFT 202 does not have an Loff region in Embodiment 1, but a structure having an Loff region may also be used.

Further, the electric current control TFT 202 is a p-channel TFT in Embodiment 1, but it may also be an n-channel TFT.

Note that the EL panel of Embodiment 1 shows an extremely high reliability, and its operational characteristics are also increased, by arranging optimal, structured TFT in not only the pixel portion, but also in the driver circuit portion.

First, a TFT having a structure in which hot carrier injection is reduced so as not to have a very large drop in operational speed is used as an n-channel TFT 203 of a CMOS circuit forming the driver circuit portion. Note that circuits such as a shift register, a buffer, a level shifter, and a sampling circuit (sample and hold circuit) are included as the driver circuits here. Signal conversion circuits such as a D/A converter can also be included when performing digital drive.

A semiconductor layer of the n-channel TFT 203 of the CMOS circuit in Embodiment 1 contains a source region 221, a drain region 222, an Lov region 223, and a channel forming region 224.

Further, it is not necessary to be concerned with the off current for the n-channel TFT 203, and importance may be placed more on the operation speed than the off current. The formation of the Lov region 223 overlapping the gate electrode 120 through the gate insulating film 106 is therefore effective in increasing the operating speed because the resistance components are reduced as much as possible.

Further, a semiconductor layer of a p-channel TFT 204 of the CMOS circuit contains a source region 231, a drain region 232, an Lov region 233, and a channel forming region 234.

Note that, in practice, it is preferable to perform packaging (sealing) by a protecting film having high airtight characteristics and little outgassing (such as a laminate film or an ultraviolet hardened resin film) or by a transparent sealing material after completing up through to the processes of FIG. 6B so as to have no exposure to the atmosphere. Further, if an inert gas is placed in the inside of the sealing material, and a drying agent (barium oxide, for example) is arranged on the inside of the sealing material, then the reliability of the EL element is increased.

Further, a connector (flexible printed circuit, FPC) is attached in order to connect the elements formed on the substrate, with terminals extended from the circuits, to external signal terminals after increasing the airtight characteristics in accordance with the packaging process or the like. A manufactured product is thus completed. This type of deliverable state is referred to as an EL display device throughout this specification.

The widths of the gate electrodes differ as stated above with the present invention. Therefore, it is possible to make the ion concentration within the semiconductor layers arranged under the first gate electrode less than the ion concentration within the semiconductor layers not arranged under the first gate electrode by utilizing the difference in ion penetration depth, due to the differing gate electrode thicknesses, when performing ion injection using the gate electrodes as mask.

Further, in order to form the Loff regions using a mask, only the width of the first gate electrode and the width of the second gate electrode need to be controlled by etching. Control of the Loff region and Lov region positions becomes easier compared to the conventional examples. It therefore becomes easy to have precise positional alignment of the Lov regions and the Loff regions, and it becomes easy to manufacture TFTs having desired characteristics.

Furthermore, the electric power source supply line, conventionally formed from the same film as the gate signal line or the source signal line, is formed between the second interlayer insulating film and the third interlayer insulating film. The electric power source supply line can be formed overlapping the gate signal line, and therefore the aperture ratio can be increased.

Note that although an example in which light emitted from the EL layer is directed toward the substrate is explained in Embodiment 1, the present invention is not limited to this, and a structure in which the light emitted from the EL layer is directed above the substrate may also be used. In this case, the cathode of the EL element becomes the pixel electrode, and it is preferable that the electric current control TFT be an n-channel TFT.

Embodiment 2

A top surface diagram of a pixel of an EL display device having two thin film transistors is explained in Embodiment 2.

Figure 7A:
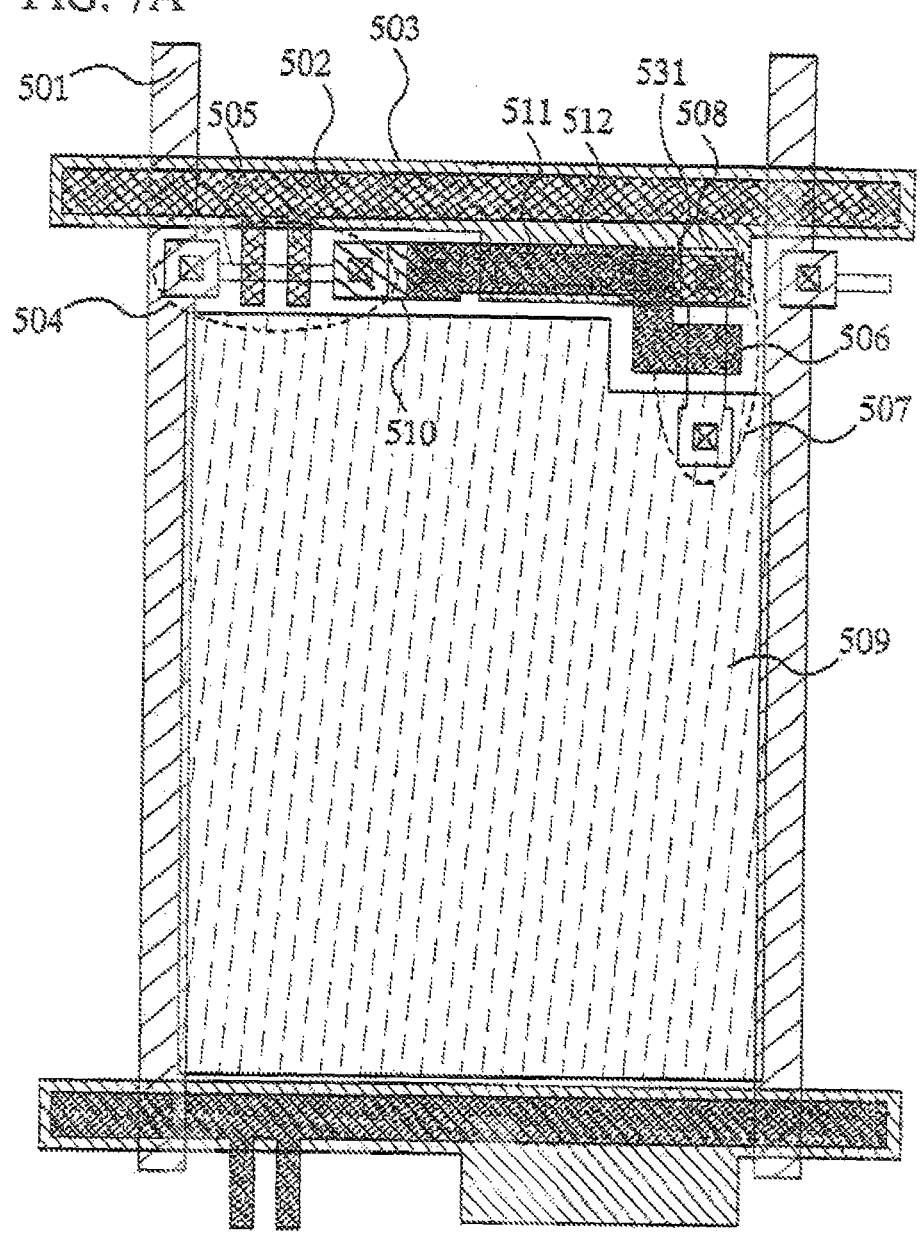
FIGS. 7A and 7B are a top surface view and a circuit diagram, respectively, of a pixel of an EL display device of Embodiment 2.
Figure 7B:
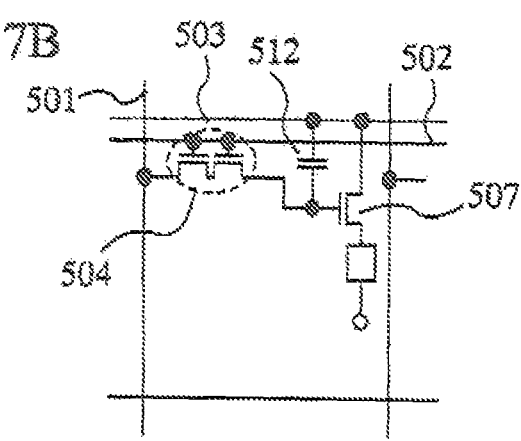

A top surface diagram of an EL display device of Embodiment 2 is shown in FIG. 7A. Further, a circuit diagram of a pixel of the EL display device of Embodiment 2 is shown in FIG. 7B. Reference numeral 501 denotes a source signal line, and reference numeral 502 denotes a gate signal line. A wiring 503 formed on the gate signal line 502 is an electric power source supply line, and overlaps with the gate signal line 502.

Reference numeral 504 denotes a switching TFT, and the switching TFT has a semiconductor layer 505. A portion of the gate signal line 502 is formed on the semiconductor layer 505 as a gate electrode. One of a source region and a drain region of the semiconductor layer 505 is connected to the source wiring 501, and the other is connected to a capacitor wiring 511 by a drain wiring 510. The electric power source supply line 503 is connected to a first interlayer insulating film (not shown in the figures) by a portion denoted by reference numeral 512, and a storage capacitor is formed by the electric power source supply line 503, the first interlayer insulating film, and the capacitor wiring 511.

The capacitor wiring 511 is connected to a gate electrode 506 of an electric current control TFT 507. The electric current control TFT 507 has a semiconductor layer 508, a source region of the semiconductor layer 508 is connected to the electric power source supply line 503 through a source wiring 531, and a drain region of the semiconductor layer 508 is connected to a pixel electrode 509.

The electric power source supply line 503 is formed between a second interlayer insulating film and a third interlayer insulating film in the present invention. The electric power source supply line can therefore be formed overlapping the gate signal line, and the aperture ratio can be increased.

Embodiment 3

An example of forming a capacitor wiring, a gate insulating film, and a semiconductor layer in addition to a structure formed by a storage capacitor, a capacitor wiring, a first interlayer insulating film, and an electric power source supply line is explained in Embodiment 3. Note that the same reference symbols are used for portions shown in FIGS. 3A to 6B.

Figure 8:
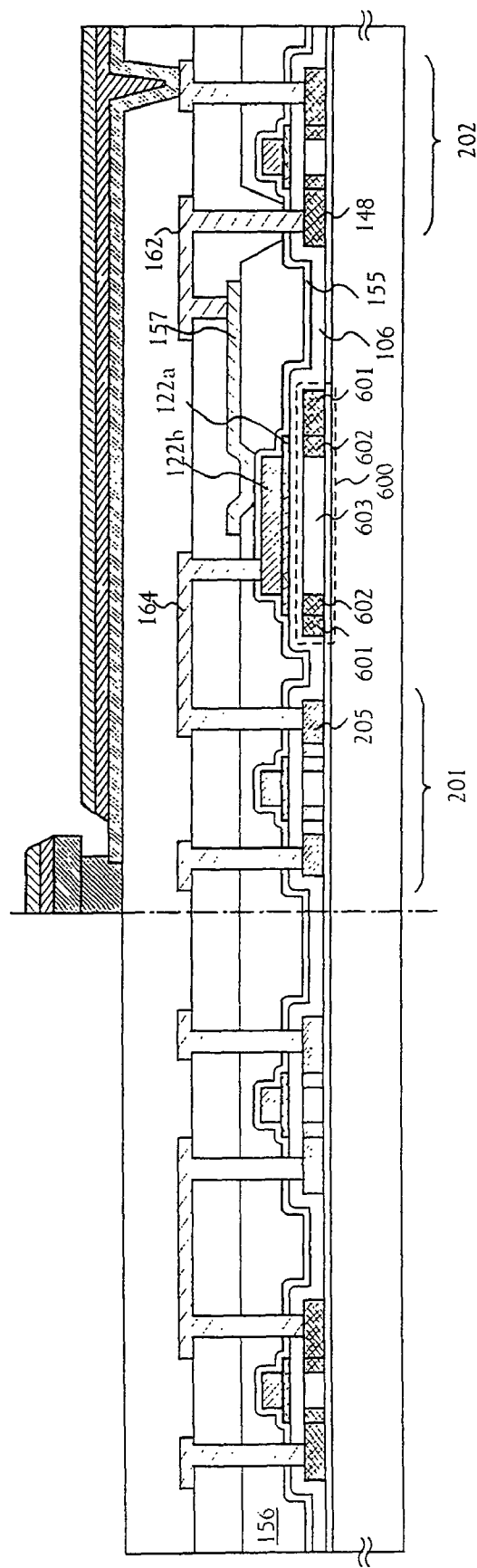
FIG. 8 is a cross sectional diagram of an EL display device of Embodiment 3.

FIG. 8 shows a cross sectional diagram of an EL display device of Embodiment 3. The EL display device of Embodiment 3 differs from the EL display device shown by FIG. 6B in that it has a semiconductor layer 600. Other structures have already been explained in Embodiment 1. Embodiment 1 may be referenced regarding a detailed structure of the EL display device of Embodiment 3, which is omitted here.

The semiconductor layer 600 overlaps with a first capacitor wiring 122a and a second capacitor wiring 122b, sandwiching the gate insulating film 106. The semiconductor layer 600 has a channel forming region 603, a first impurity region 602 formed so as to contact an edge portion of the channel forming region 603, and a second impurity region 601 formed so as to contact the first impurity region 602. The impurity concentration in the first impurity region 602 is lower than the impurity concentration in the second impurity region 601. Further, the first impurity region 602 overlaps with the first capacitor wiring 122a, sandwiching the gate insulating film 106.

Note that when the electric current control TFT 202 is a p-channel TFT as in Embodiment 3, it is preferable to add a p-type impurity element into the first impurity region 602 and the second impurity region 601. Conversely, it is preferable to add an n-type impurity element into the first impurity region 602 and the second impurity region 601 for cases in which the electric current control TFT 202 is an n-channel TFT.

The second capacitor wiring 122b is electrically connected to the drain region 205 of the switching TFT 201 by the drain wiring 164. Further, the electric power source supply line 157 contacts the first interlayer insulating film 155 on the second capacitor wiring 122b through the contact hole formed in the second interlayer insulating film 156. In addition, the electric power source supply line is connected to the source region 148 of the electric current control TFT 202 through the contact hole formed in the gate insulating film 106, the first interlayer insulating film 155 and the second interlayer insulating film 156.

The capacitance value of the storage capacitor can be increased in accordance with the structure of Embodiment 3. Note that light emitted from the EL layer is directed toward the substrate in Embodiment 3, and therefore the brightness of the EL display device becomes less due to a drop in the aperture ratio if the surface area of the storage capacitor is increased. However, with the structure of Embodiment 3, the storage capacitor formed by the capacitor wiring 122, the gate insulating film 106, and the semiconductor layer 600 overlaps with the storage capacitor formed by the electric power source supply line 157, the first interlayer insulating film 155, and the capacitor wiring 122, and therefore the capacitance value of the storage capacitor can be raised without lowering the aperture ratio.

Note that although an example in which light emitted from the EL layer is directed toward the substrate is explained in Embodiment 3, the present invention is not limited to this, and a structure in which the light emitted from the EL layer is directed above the substrate may also be used. In this case, the cathode of the EL element becomes the pixel electrode, and it is preferable that the electric current control TFT be an n-channel TFT.

Embodiment 4

An example of forming an electric power source supply line and a shielding film (black matrix) at the same time is explained in Embodiment 4. Note that the same reference symbols are used for portions shown by FIGS. 3A to 6B.

Figure 9:
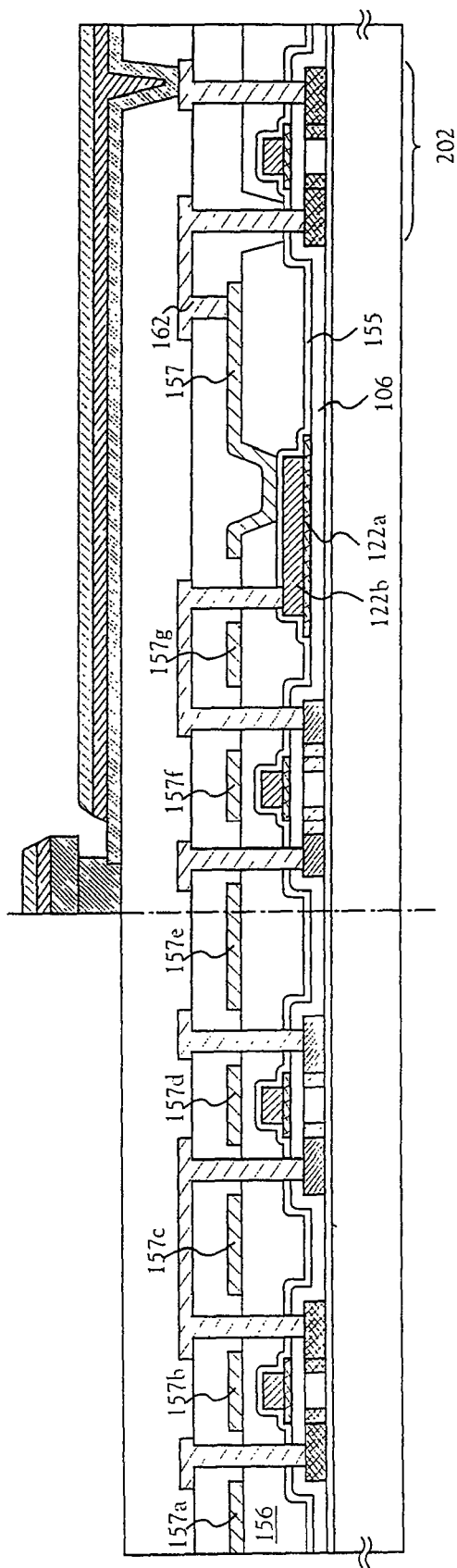
FIG. 9 is a cross sectional diagram of an EL display device of Embodiment 4.

FIG. 9 shows a cross sectional diagram of an EL display device of Embodiment 4. The EL display device of Embodiment 4 differs from the EL display device shown by Fire 6B in that it has shielding films 157a to 157g. Note that other structures have already been explained in Embodiment 1, and therefore Embodiment 1 may be referenced regarding a detailed structure of the EL display device of Embodiment 4, which is omitted here.

The electric power source supply line 157 contacts the first interlayer insulating film 155 on the second capacitor wiring 122b through the contact hole formed in the second interlayer insulating film 156. In addition, the electric power source supply line 157 is connected to the source region 148 of the electric current control TFT 202 through the contact hole formed in the gate insulating film 106, the first interlayer insulating film 155 and the second interlayer insulating film 156.

The shielding films 157a to 157g are formed on the second interlayer insulating film at the same time as the electric power source supply line 157. An increase in the off current due to light from external to the EL display device, and light emitted from the EL element, being injected to the channel forming regions of the TFTs can be prevented by forming the shielding films 157a to 157g.

Further, it is possible to form the shielding films 157a to 157g of Embodiment 4 at the same time as the electric power source supply line 157, and an increase in the number of process steps is unnecessary.

Note that it is very important in Embodiment 4 that the shielding films 157a to 157g and the electric power source supply line 157 be formed by a material through which it is difficult for light to pass.

Although an example in which light emitted from the EL layer is directed toward the substrate is explained in Embodiment 4, the present invention is not limited to this, and a structure in which the light emitted from the EL layer is directed above the substrate may also be used. In this case, the cathode of the EL element becomes the pixel electrode, and it is preferable that the electric current control TFT be an n-channel TFT.

Note that it is possible to implement Embodiment 4 in combination with Embodiment 3.

Embodiment 5

An example of forming a light shielding film between a substrate and a semiconductor layer of a TFT is explained in Embodiment 5. Note that the same reference symbols are used for portions shown by FIGS. 3A to 6B.

Figure 10:
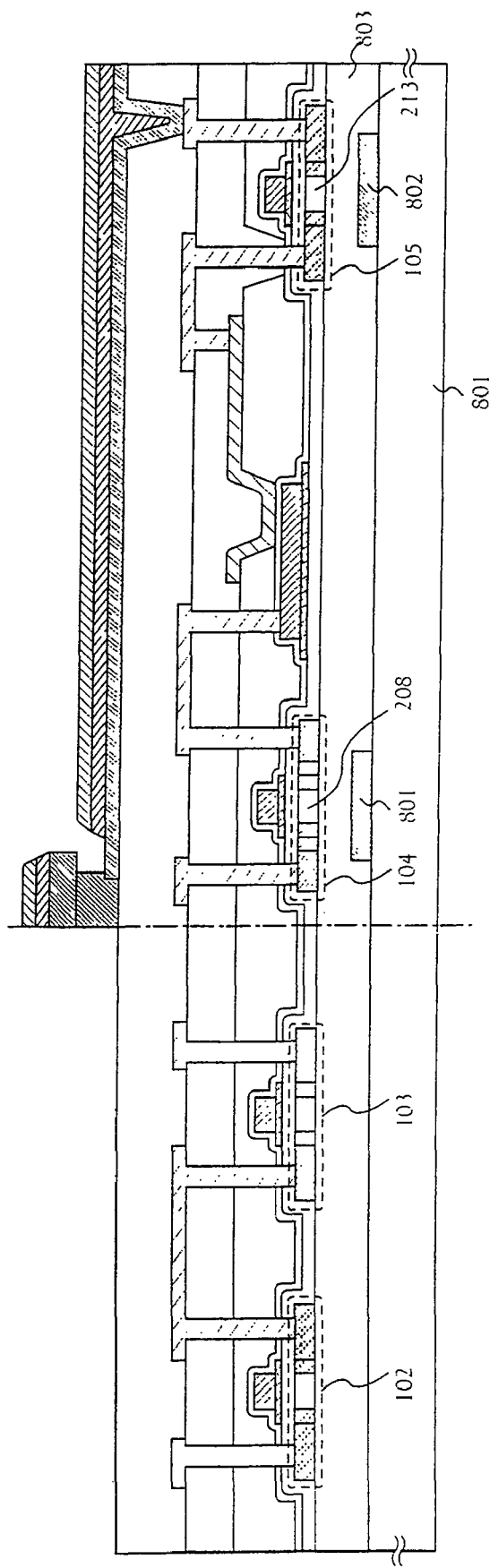

FIG. 10 shows a cross sectional diagram of an EL display device of Embodiment 5. The EL display device of Embodiment 5 differs from the EL display device shown by FIG. 6B in that it has light shielding films 801 and 802. Note that other structures have already been explained in Embodiment 1, and therefore Embodiment 1 may be referenced regarding a detailed structure of the EL display device of Embodiment 5, which is omitted here.

The light shielding films 801 and 802 are formed below the semiconductor layer 104 of the switching TFT and below the semiconductor layer 105 of the electric current control TFT in the EL display device of Embodiment 5. The light shielding films 801 and 802 overlap with the channel forming region 208 of the semiconductor layer 104 of the switching TFT, and with the channel forming region 213 of the semiconductor lower 105 of the electric current control TFT, sandwiching an insulating film (an oxide film in Embodiment 5) 803.

The light shielding films 801 and 802 can shield light, and it is possible to use any material provided that the material can withstand the heat treatment process temperatures of steps after the light shielding films are formed. It is possible to use materials such as metals and silicon, through which light does not easily pass, and W is used in Embodiment 5. Note that it is preferable that the thickness of the light shielding films 801 and 802 be on the order of 0.1 to 0.5 µm. Further, it is preferable that the thickness of the oxide film 803 be on the order of 0.5 to 1.5 µm. In addition, it is preferable that the distance between the light shielding films 801 and 802 and the semiconductor layers 104 and 105 be on the order of 0.1 to 0.5 µm.

Note that, although the light shielding film is only formed under the TFTs formed in the pixel portion in Embodiment 5, Embodiment 5 is not limited to this structure. The light shielding films may also similarly be formed under the TFTs of the driver circuits.

An increase in the TFT off current due to light injected from under the substrate to the channel forming regions is prevented in accordance with the above structure in Embodiment 5.

If the oxide film 803 does not have a leveled surface, then a problem occurs in which the semiconductor layers formed on top of the oxide film 803 are not uniformly crystallized during crystallization. The semiconductor lasers are formed directly on the oxide film 803, and therefore it is preferable to level the surface of the oxide film 803 before forming the semiconductor layers.

For example, the oxide film 803 may be leveled by CMP (chemical mechanical polishing). CMP can be performed using a known method.

Polishing using a mixture of silica gel and an electrolytic solution is performed in Embodiment 5. Polishing is performed in the electrolytic solution by applying a pressure of 100 kg/cm$^2$ to a polishing pad. The pressure during polishing can be selected from within the range of 50 to 150 kg/cm$^2$. Further, polishing is performed with a gap of 0.1 µm between the surface being polished and the polishing pad.

The TFT off current can be suppressed and non-uniformities in the crystallinity of the semiconductor layers can be prevented in accordance with the above structure.

Although an example in which light emitted from the EL layer is directed toward the substrate is explained in Embodiment 5, the present invention is not limited to this, and a structure in which the light emitted from the EL layer is directed above the substrate may also be used. In this case, the cathode of the EL element becomes the pixel electrode, and it is preferable that the electric current control TFT be an n-channel TFT.

Note that it is possible to implement Embodiment 5 in combination with Embodiment 3 and Embodiment 4.

Embodiment 6

An example of forming a gate signal line after forming a source signal line is explained in Embodiment 6.

Figure 11A:
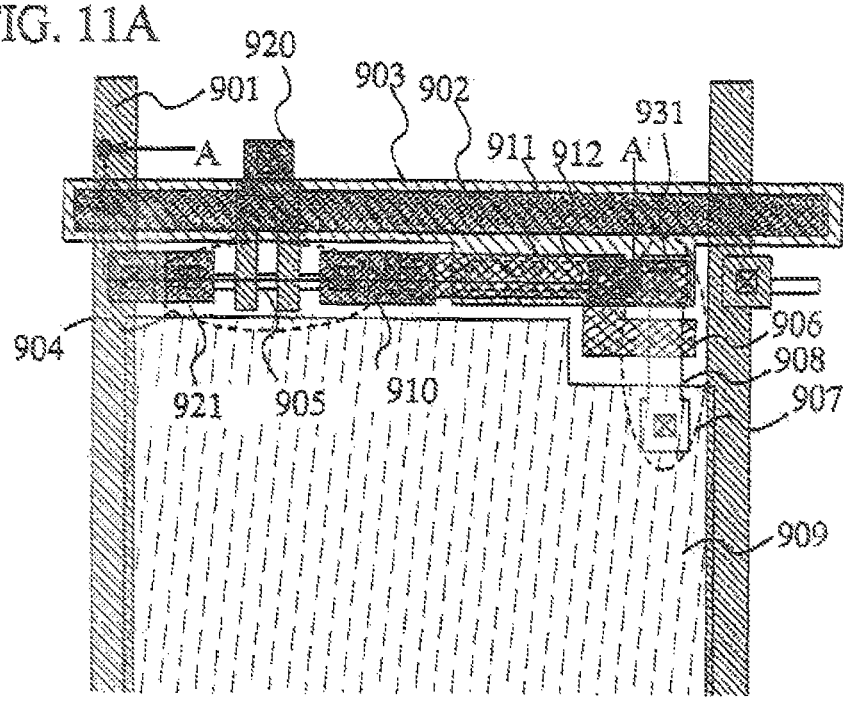
FIGS. 11A and 11B are a top surface view and a cross sectional diagram, respectively, of a pixel of an EL display device of Embodiment 6.
Figure 11B:
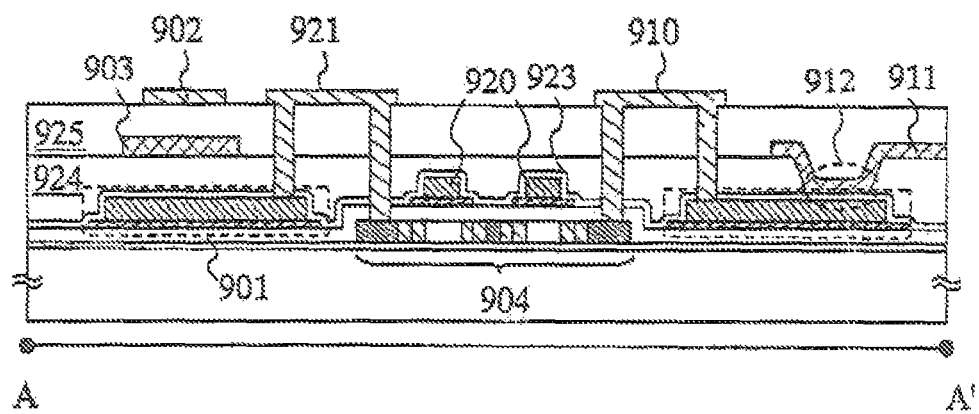

FIG. 11A shows a top surface diagram of an EL display device of Embodiment 6. Note that FIG. 11B is a cross sectional diagram of FIG. 11A cut along the line A-A'. Reference numeral 901 denotes a source signal line, and reference numeral 902 denotes a gate signal line. A wiring 903 formed under the gate signal line 902 is an electric power source supply line, and the wiring 903 overlaps with the gate signal line 902, sandwiching an insulating film.

Reference numeral 904 denotes a switching TFT, and the switching TFT 904 has a semiconductor layer 905. A gate electrode 920 connected to the gate signal line 902 is formed on the semiconductor layer 905. One of a source region and a drain region of the semiconductor layer 905 is connected to the source signal line 901 by a source wiring 921, and the other is connected to a capacitor wiring 911 by a drain wiring 910. The electric power source supply line 903 contacts a first interlayer insulating film 923 by a portion denoted by reference numeral 912, and a storage capacitor is formed by the electric power source supply line 903, the first interlayer insulating film 923, and the capacitor wiring 911.

The capacitor wiring 911 is connected to a Late electrode 906 of an electric current control TFT 907. The electric current control TFT 907 has a semiconductor layer 908, and a source region of the semiconductor layer 908 is connected to the electric power source supply line 903 through a source wiring 931, and a drain region of the semiconductor layer 908 is connected to a pixel electrode 909.

The electric power source supply line 903 is formed between a second interlayer insulating film 924 and a third interlayer insulating film 925 with the present invention. The electric power source supply line can thus be formed overlapping with the gate signal line, and the aperture ratio can therefore be increased.

Embodiment 7

In this embodiment, an example will be described in which a crystalline semiconductor film used as semiconductor layers in the embodiment mode is formed by a thermal crystallization method using a catalytic element. In the case of using a catalytic element, it is preferable to use technologies disclosed in Japanese Patent Laid-Open No. 7-130652 and Japanese Patent Laid-Open No. 8-78329.

Figure 12A:
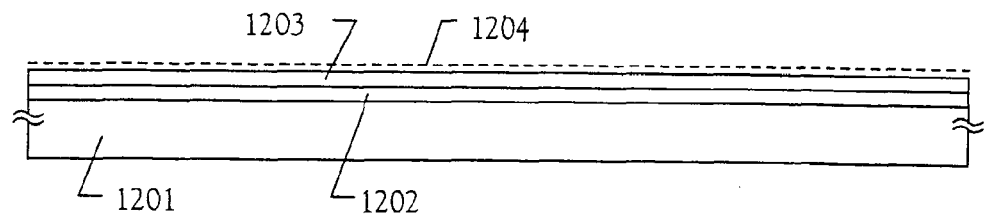
FIGS. 12A and 12B are diagrams showing a method of crystallizing a semiconductor layer of Embodiment 7.
Figure 12B:
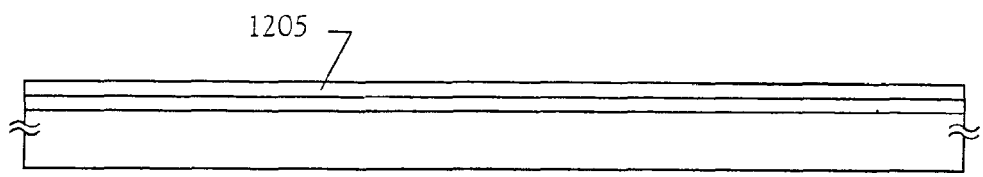

Here, an example will be described in FIGS. 12A and 12B in which the technology disclosed in Japanese Patent Laid-Open No. 7-130652 is applied to the present invention. First, a silicon oxide film 1202 was formed on a substrate 1201 and then an amorphous silicon film 1203 was formed thereon. Further, a nickel acetate solution containing 10 ppm by weight of nickel was applied thereon to form a nickel-containing layer 1204 (see FIG. 12A).

Next, the substrate was subjected to dehydrogenation at 500° C. for one hour and then was subjected to a heat treatment at 500° C. to 650° C. for 4 hours to 12 hours (in the present preferred embodiment, at 550° C. for 8 hours) to form a crystalline silicon film 1205. The crystalline silicon film 1205 formed in this manner had a very excellent crystalline property (see FIG. 12B).

Also, the technology disclosed in Japanese Patent Laid-Open No. 8-78329 makes it possible to crystallize an amorphous semiconductor film selectively by doping a catalytic element selectively. An example in which this technology was applied to the present invention will be described with reference to FIGS. 13A and 13B.

First, a silicon oxide film 1302 was formed on a glass substrate 1301 and then an amorphous silicon film 1303 and a silicon oxide film 1304 were formed in sequence thereon. At that time, the thickness of the silicon oxide film 1304 is made 150 nm.

Figure 13A:
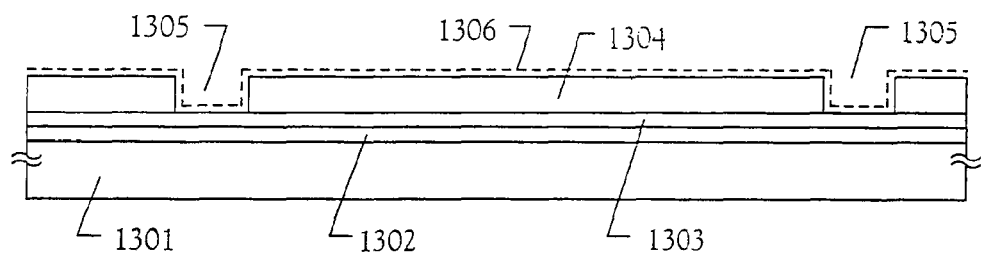
FIGS. 13A and 13B are diagrams showing a method of crystallizing a semiconductor layer of Embodiment 7.
Figure 13B:
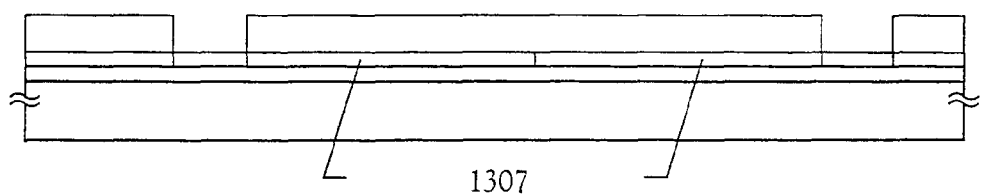

Next, the silicon oxide film 1304 was patterned to form apertures 1305 selectively and then a nickel acetate solution containing 10 ppm by weight of nickel was applied thereon to form a nickel-containing layer 1306 and the nickel containing layer 1306 was brought into contact with the amorphous silicon film 1302 only at the bottom of the aperture 1305 (see FIG. 13A).

Next, the substrate was subjected to a heat treatment at 500° C. to 650° C. for 4 hours to 24 hours (in the present preferred embodiment, at 570° C. for 14 hours) to form a crystalline silicon film 1307. In this crystallization process, a part of the amorphous silicon film in contact with nickel was first crystallized and then crystallization proceeded in the lateral direction. The crystalline silicon film 1307 formed in this way formed a crystalline texture including rod-shaped or needle-shaped crystals and each crystal thereof grew macroscopically in a specific direction and hence was uniform in crystalline property, which is an advantage of this crystalline silicon film 1307. (See FIG. 13B)

In this respect, in the two technologies described above, the following catalytic elements may be used in addition to nickel (Ni): germanium (Ge), iron (Fe), palladium (Pd), tin (Sn), lead (Pb), cobalt (Co), platinum (Pt), copper (Cu), and gold (Au).

The semiconductor layer of the crystalline TFT can be formed by forming a crystalline semiconductor film (including a crystalline silicon film, a crystalline silicon germanium film, or the like) and then by patterning it. The TFT made of a crystalline semiconductor film by using the technology of the present preferred embodiment can produce an excellent characteristic and hence has been required to be of high reliability. However, the adoption of the TFT structure in accordance with the present invention can produce a TFT making the most use of the technology of the present preferred embodiment.

In this embodiment, a method in which a crystalline semiconductor film was formed by using an amorphous semiconductor film as a starting film, and by using the above described catalytic element and then the catalytic element was removed from the crystalline semiconductor film, will be described as a method of forming the semiconductor layers used in the embodiment 1. In the present preferred embodiment 7, the technologies disclosed in Japanese Patent Laid-Open No. 135468 or Japanese Patent Laid-Open No. 10-135469 were used as the method.

The technology disclosed in the above references is the one removing a catalytic element used for the crystallization of an amorphous semiconductor film by the gettering action of phosphorus after the crystallization. The concentration of the catalytic element in the crystalline semiconductor film can be reduced to $1\times10^{17}$ atoms/cm$^3$ or less, more preferably, $1\times10^{16}$ atoms/cm$^3$ or less, by using this technology.

Figure 14A:
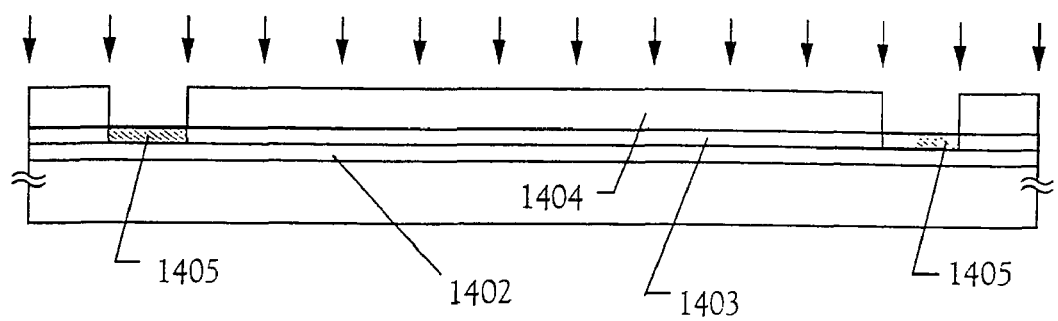
FIGS. 14A and 14B are diagrams showing a method of crystallizing a semiconductor layer of Embodiment 7.
Figure 14B:
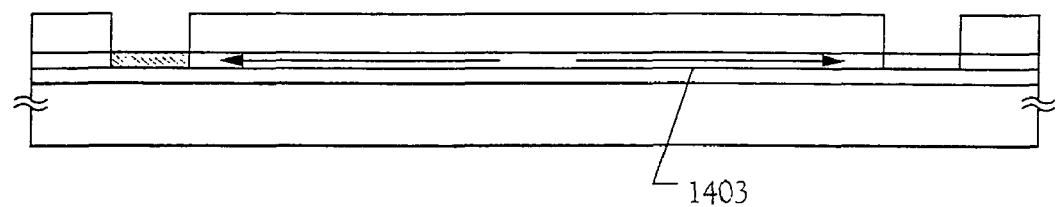

The constitution of the present preferred embodiment will be described with reference to FIGS. 14A and 14B. Here, a nonalkali glass substrate, typically, a 1737 substrate made by Corning Corp., was used. FIG. 14A shows a state in which an underlayer film 1402 and a crystalline silicon film 1403 were formed by using the technology of crystallization described in the embodiment 4. Then, a silicon oxide film 1404 for masking was formed on the surface of the crystalline silicon film 1403 to a thickness of 150 nm and then apertures were formed by, patterning to form regions exposing the crystalline silicon film 1403. Then, a phosphorus addition process was performed to form the regions 1405 to which phosphorus was added in the crystalline silicon film.

The substrate in this state was subjected to a heat treatment in a nitrogen atmosphere at 550° C. to 800° C. for 5 hours to 24 hours (in the embodiment, at 600° C. for 12 hours), whereby the region 1405 to which the phosphorus was added acted on the crystalline silicon film 1403 as a gettering site to move catalytic elements remaining in the crystalline silicon film 1403 to the regions 1405 to which the phosphorus was added.

Then, the silicon oxide film 1404 for masking and the region 1405 to which the phosphorus was added were removed by etching to form a crystalline silicon film in which the concentration of the catalytic element used in the crystallization process was reduced to $1\times10^{17}$ atoms/cm$^3$ or less. This crystalline silicon film could be used as it, was as the semiconductor layer of the TFT in accordance with the present invention described in the embodiment mode.

Embodiment 8

An example of fabricating an EL (Electroluminescence) display device using the present invention will be explained in embodiment 8. Note that FIG. 15A is a top view of an EL display device using the present invention, and FIG. 15B is a cross sectional view thereof.

Figure 15A:
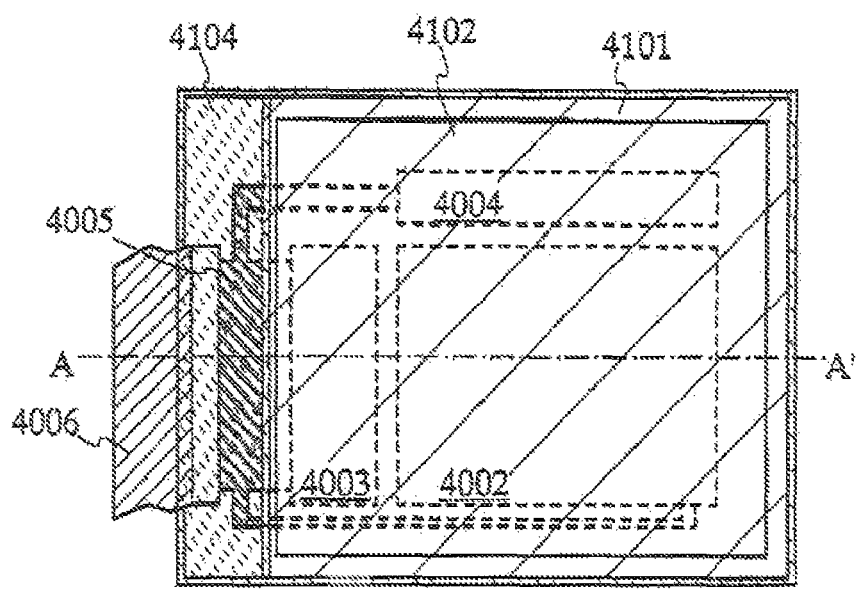
FIGS. 15A and 15B are an external view and a cross sectional diagram, respectively of an EL display device of Embodiment 8.
Figure 15B:
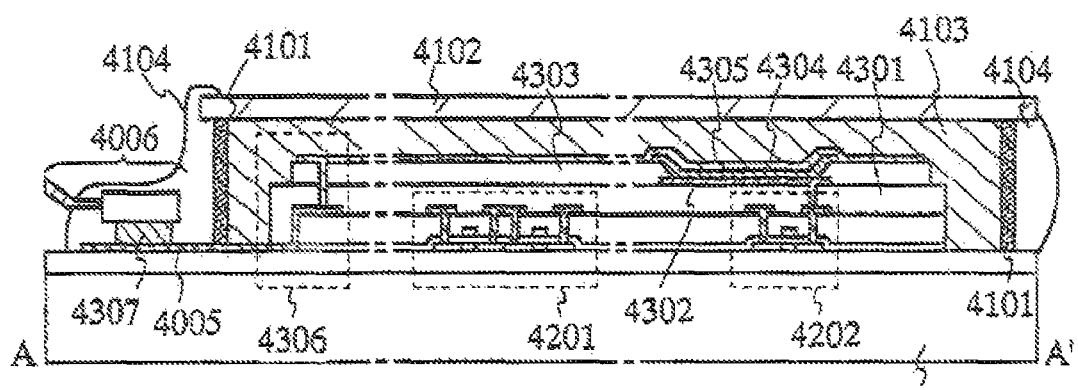

In FIG. 15A and FIG. 15B, reference numeral 4001 denotes a substrate, 4002 denotes a pixel portion, 4003 denotes a source side driving circuit, 4004 denotes a gate side driving circuit. The driving circuits are connected to external equipment, through an FPC (flexible printed circuit) 4006 via a wiring 4005.

At this time, a first sealing material 4101, a covering material 4102, a filer material 4103 and a second sealing material 4104 are provided so as to enclose the pixel portion 4002, source side driving circuit 4003, and gate side driving circuit 4004.

A cross sectional diagram of FIG. 15A cut along the line A-A' is shown in FIG. 15B. On the substrate 4001, a driver circuit TFT 4201 included in the source side driving circuit 4003 (an n-channel TFT and a p-channel TFT are shown here) and a current controlling TFT 4202 included in the pixel portion 4002 (a TFT for controlling the current flowing to an EL element is shown here) are formed.

In this embodiment, the driver circuit TFT 4201 is fabricated using p-channel TFT or n-channel TFT forming by a known method, and the current controlling TFT 4202 is fabricated using p-channel TFT forming by a known method. Further, the storage capacitor (not shown in the figure) connected to the gate of the current controlling TFT 4202 is provided in the pixel portion 4002.

An interlayer insulating film (leveling film) 4301 made from a resin material is formed on the driver circuit TFT 4201 and the current controlling TFT 4202, and a pixel electrode (anode) 4302 electrically connected to a drain of the current controlling TFT 4202 thereon. The pixel electrode 4302 is formed from a transparent conductive film having large work function. As the transparent conductive film, an indium oxide and tin oxide compound or an indium oxide and zinc oxide compound can be utilized. Further, the above mentioned transparent conductive film with which is doped gallium can also be used.

Then, an insulating film 4303 is formed on the pixel electrode 4302, and an opening portion is formed on the pixel electrode 4302. At the opening portion, an EL (Electroluminescence) layer 4304 is formed on the pixel electrode 4302. A known organic EL material or inorganic EL material is used as the EL layer 4304. Both of low molecular type (monomer based) organic EL materials and hitch molecular type (polymer based) organic EL materials can be used as the organic materials.

A known technique of evaporation method or painting method may be used to form the EL layer 4304. The EL layer may have a lamination structure by freely combining a hole injecting layer, a hole transporting layer, a light emitting layer, an electron transporting layer, and an electron injecting layer, or a single layer structure.

On the EL layer 4304, a cathode 4305 made of a conductive film having a light-shielding property (typically, a conductive film comprising aluminum, copper, or silver as a main component, or a lamination film of those and other conductive film) is formed. It is preferable to remove as much as possible any moisture or oxygen existing in the interface between the cathode 4305 and the EL layer 4304. It is therefore necessary to use a method of depositing continuously the cathode 4305 and the EL layer 4304 in vacuum or depositing the EL layer 4304 in an atmosphere of nitrogen or in a rare gas atmosphere, thereby a cathode 4305 is formed without exposing to oxygen and moisture. The above film deposition becomes possible in embodiment 8 by using a multi-chamber method (cluster tool method) film deposition apparatus.

Then, the cathode 4305 is electrically connected to the wiring 4005 in the region denoted by reference numeral 4306. The wiring 4005 for imparting a predetermined voltage to the cathode 4305 is connected to the FPC 4006 through an anisotropic conducting film 4307.

As mentioned above, an EL element is made from the pixel electrode (anode) 4302, the EL layer 4304 and the cathode 4305. The EL element is enclosed with a covering material 4102 which is laminated with the substrate 4001 through a first sealing material 4101 and a first sealing material 4101, and sealed with a filer material 4103.

Materials such as a glass material, a metal material (typically, a stainless steel plate), a ceramic material, and a plastic material (including a plastic film) can be used as the covering material 4102. As a plastic material, an FRP (fiberglass-reinforced plastic) material, a PVF (polyvinyl fluoride) film, a Mylar film, a polyester film, and an acrylic film can be used. It is preferable to use a sheet structure in which aluminum foil is sandwiched by a PVF film or a Mylar film.

Note that, for a case in which the emission direction of light emitted from ha EL element is directed to the covering material side, it is necessary for the covering material to possess transparency. In the case, a transparent material such as a glass plate, a plastic plate, a polyester film or an acrylic film can be used.

Additionally, a filler material 4103 is formed using ultraviolet curing resin or thermally curable resin. PVC (polyvinyl chloride), acrylic, polyamide, epoxy resin, silicone resin, PVB (polyvinyl butyral), and EVA (ethylene vinyl acetate) can be used as the filler material. If a drying agent (preferably, barium oxide) is formed on the inside of the filler material 4103, then it can suppress the degradation of the EL element.

Further, spacer may be contained in the filler material 4103. At this time, the spacer is formed by using barium oxide, thereby the spacer itself has a hygroscopic property. Further, in the case of providing the spacer, it is effective that a resin film is provided on the cathode 4305 as a buffer layer for relaxation of pressure from the spacer.

Further, the wiring 4005 is electrically connected to the FPC 4006 via the anisotropic conductive film 4307. The wiring 4005 transmits signals forwarding the pixel portion 4002, source side driving circuit 4003 and gate side driving circuit 4004 to the FPC 4006 and are electrically connected to external equipment through the FPC 4006.

Also, in the present embodiment, a second sealing material 4104 is provided to cover an exposure portion of the first sealing material 4101 and portion of the FPC 4006 to obtain the structure in which the EL element is completely shut out from the outside. In this way, the EL display device has a cross sectional structure shown in FIG. 15B.

Embodiment 9

The EL display device of the present invention can have the structure which provides any TFTs in the pixel. It is possible to provides 1 to 6 TFTs or more. The present invention can perform not limited to the pixel structure of the EL display device.

Embodiment 10

Figure 18:
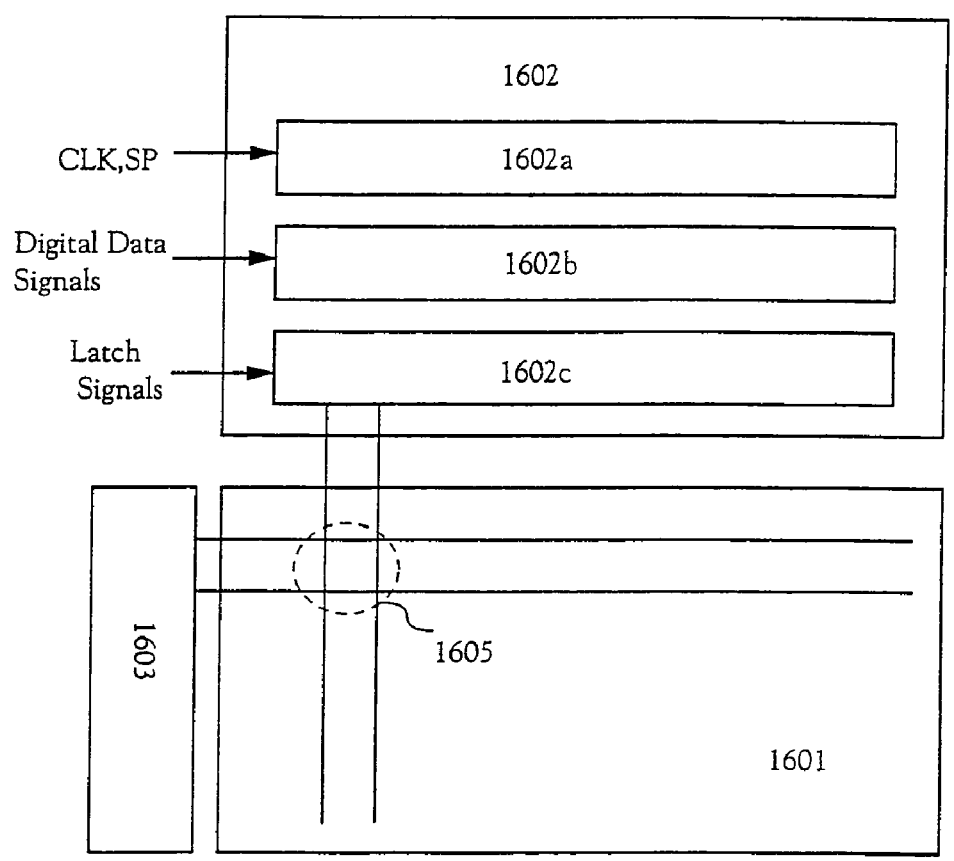
FIG. 18 is a block diagram of an EL display device of Embodiment 10.

A driver portion of an EL display device of the present invention is explained in Embodiment 10 using FIG. 18.

An example of a block diagram of the EL display de % ice of the present invention is shown in FIG. 18. The EL display device of FIG. 18 has, in accordance with TFTs formed on a substrate, a pixel portion 1601, and a source signal line driver circuit 1602 and a gate signal line driver circuit 1603 formed in the periphery of the pixel portion. Note that the EL display device of Embodiment 10 has one each of the source signal line driver circuit and the gate signal line driver circuit, but there are no limits on the number of source signal line driver circuits and gate signal line driver circuits in the present invention.

The source signal line driver circuit 1602 basically has a shift register 1602a, a latch (A) 1602b, and a latch (B) 1602c.

A clock signal CLK and a start pulse SP are input to the shift register 1602a in the source signal line driver circuit 1602. The shift register 1602a generates timing signals in order based upon the clock signal CLK and the start pulse SP, and the timing signals are supplied one after another to downstream circuits.

The timing signals from the shift register circuit 1602a may be buffer amplified by a circuit such as a buffer (not shown in the figure). The load capacitance (parasitic capacitance) of a wiring which supplies the timing signals is large because many of the circuits and elements are connected to the wiring. The buffer is formed in order to prevent dullness in the rise and fall of the timing signal, generated due to the large load capacitance.

The timing signals buffer amplified by a buffer from the shift register 1602a are supplied to the latch (A) 1602b. The latch (A) 1602b has a plurality of latch stages for processing digital data signals containing image information. The latch (A) 1602b writes in and maintains a digital data signal simultaneously with the input of the timing signal.

Note that the digital data signal may also be input in order to the plurality of latch stages of the latch (A) 1602b when writing in the digital data signal to the latch (A) 1602b. However, the present invention is not limited to this structure. The plurality of latch stages of the latch (A) 1602b may be divided into a number of groups, and the digital data signal may be input to the respective groups at the same time in parallel, performing so-called partitioned driving. The number of groups at this time is called the partitioned number. For example, this is referred to as partitioned drive with 4 divisions when the latches are divided into groups every four stages.

A period until the digital data signal is completely written into all of the latch stages of the latch (A) 1602b is referred to as a line period. Namely, the line period begins at the point when the digital data signal is written into the leftmost stage latch within the latch (A) 1602b, and is completed when the digital data signal is written into the rightmost stage latch. In practice, there are times when the line period includes the addition of a horizontal return period to the above line period.

A latch signal is supplied to the latch (B) 1602c when one line period is complete. The digital data signal written into and stored in the latch (A) 1602b is sent all at once at this instant to the latch (B) 1602c, and is written into all of the stage latches of the latch (B) 1602c, and stored.

Write-in of the digital data signal is again performed, in order, to the latch (A) 1602b after it has completed sending the digital data signal to the latch (B) 1602c, based on the timing signal from the shift register 1602a.

The digital data signal written into and stored in the latch (B) 1602b is input to source signal lines during the second one line period.

An image is display in the pixel portion in accordance with the digital data signal input to the source signal lines.

Embodiment 11

The first etching process for forming the first shape conducting layers is performed at one set of etching conditions in Embodiment 1, but may also be performed under a plurality of etching conditions in order to increase the uniformity in the film reduction and the shape of the gate insulating film. An example of forming a first shape conducting layer by performing the first etching process under two etching conditions is shown in Embodiment 11.

Further, both sides of the conducting layer are formed so as to have a taper, and LDD regions are formed in both side of the channel forming region, with the present invention, but Embodiment 11 is explained in accordance with a process of manufacturing, using enlarged diagrams of one side of the vicinity of a conducting layer in an n-channel TFT of a driver circuit in FIGS. 19A to 19D. Note that, for simplicity, a base film and a substrate are not shown in the figures.

First, the same state as that of FIG. 3B is obtained in accordance with Embodiment 1. However, although Ta is used as the first conducting film in Embodiment 1, TaN, which has extremely high heat resistance characteristics, is used in Embodiment 11 as the first conducting film. The first conducting film is formed having a film thickness of 20 to 100 nm, and the second conducting film may be formed with a film thickness between 100 and 400 nm. A first conducting film made from TaN with a film thickness of 30 nm, and a second conducting film made from W having a film thickness of 370 nm are laminated and formed in Embodiment 11.

A first shape mask 1505a is formed next from resist, etching is performed by ICP, and a first shape second conducting layer 1504a is formed. A mixed gas of $CF_4$, $Cl_2$ and $O_2$ is used as an etching gas having high selectivity with respect to TaN here and therefore the state shown in FIG. 19A can be obtained. Several etching conditions and their relationship to the etching rate of the second conducting layer (W), the etching rate of the first conducting layer (TaN), and the taper angle of the second conducting layer (W) are shown in Table 1.

Figure 19A:
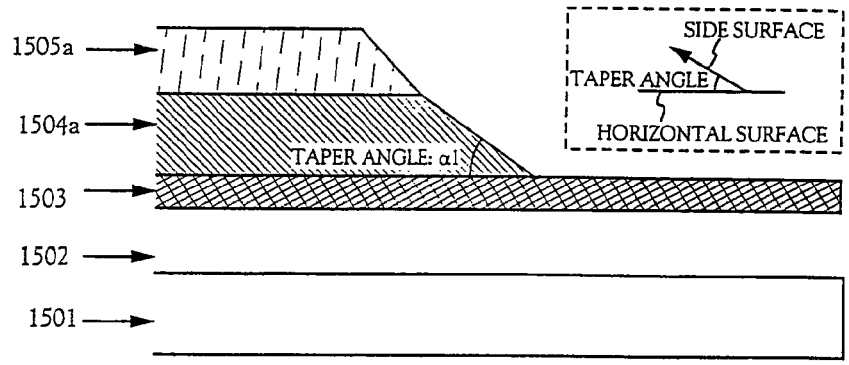
FIGS. 19A to 19D are enlarged diagrams of a TFT gate electrode of Embodiment 11.

Note that a taper angle indicates the angle formed between a horizontal plane and a side face of a material layer in this specification, as shown in the upper right diagram of FIG. 19A. Further, for convenience, the side face of a shape having a taper angle is referred to as a taper, and a portion having the taper is referred to as a tapered portion throughout this specification.

Further, the angle formed between a horizontal plane and the side face of the second conducting layer (W) (a taper angle α1) can be freely set with a range of 19 to 70° by using one of the conditions 4 to 15 within Table 1, for example. Note that the etching time may be suitable set by the operator.

Further, reference numeral 1501 in FIG. 19A denotes a semiconductor layer, reference numeral 1502 denotes a gate insulating film, and reference numeral 1503 denotes a first conducting film.

[Table 1]

TABLE

| CONDITION | ICP [W] | BIAS [W] | PRESSURE [Pa] | $CF_4$ | $Cl_2$ | $O_2$ [sccm] | W E.R. (1) [nm/min] | TaN E.R. (2) [nm/min] | SELECTIVITY OF W/TaN (1)/(2) | W TAPER ANGLE [deg] |
|---|---|---|---|---|---|---|---|---|---|---|
| | | | | | ETCHING RATE (E.R.) OF W AND TaN AND W TAPER ANGLE | | | | | |
| 1 | 500 | 20 | 1.0 | 30 | 30 | 0 | 58.97 | 66.43 | 0.899 | 80 |
| 2 | 500 | 60 | 1.0 | 30 | 30 | 0 | 88.71 | 118.46 | 0.750 | 25 |
| 3 | 500 | 100 | 1.0 | 30 | 30 | 0 | 111.66 | 168.03 | 0.667 | 18 |
| 4 | 500 | 20 | 1.0 | 25 | 25 | 10 | 124.62 | 20.67 | 6.049 | 70 |
| 5 | 500 | 60 | 1.0 | 25 | 25 | 10 | 161.72 | 35.81 | 4.528 | 35 |
| 6 | 500 | 100 | 1.0 | 25 | 25 | 10 | 176.90 | 56.32 | 3.008 | 32 |
| 7 | 500 | 150 | 1.0 | 25 | 25 | 10 | 200.39 | 80.32 | 2.495 | 26 |
| 8 | 500 | 200 | 1.0 | 25 | 25 | 10 | 218.20 | 102.87 | 2.124 | 22 |

TABLE-continued

ETCHING RATE (E.R.) OF W AND TaN AND W TAPER ANGLE

| CONDITION | ICP [W] | BIAS [W] | PRESSURE [Pa] | CF$_4$ | Cl$_2$ | O$_2$ [sccm] | W E.R. (1) [nm/min] | TaN E.R. (2) [nm/min] | SELECTIVITY OF W/TaN (1)/(2) | W TAPER ANGLE [deg] |
|---|---|---|---|---|---|---|---|---|---|---|
| 9 | 500 | 250 | 1.0 | 25 | 25 | 10 | 232.12 | 124.97 | 1.860 | 19 |
| 10 | 500 | 20 | 1.0 | 20 | 20 | 20 | — | 14.83 | — | — |
| 11 | 500 | 60 | 1.0 | 20 | 20 | 20 | 193.02 | 14.23 | 13.695 | 37 |
| 12 | 500 | 100 | 1.0 | 20 | 20 | 20 | 235.27 | 21.81 | 10.856 | 29 |
| 13 | 500 | 150 | 1.0 | 20 | 20 | 20 | 276.74 | 38.61 | 7.219 | 26 |
| 14 | 500 | 200 | 1.0 | 20 | 20 | 20 | 290.10 | 45.30 | 6.422 | 24 |
| 15 | 500 | 250 | 1.0 | 20 | 20 | 20 | 304.34 | 50.25 | 6.091 | 22 |

*) "—" in cell indicates that the measurement was not possible because the W surface was deteriorated at the etching.

Etching is performed next with a second vet of etching conditions with the mask 1505a left in place as is, forming a first shape first conducting layer 1503a. Note that the gate insulating film 1502 is also somewhat etched when performing etching under the second set of etching conditions, becoming a first shape gate insulating film 1502a. A mixed gas made from CF$_4$ and Cl$_2$ is used here as the etching gas under the second set of etching conditions. Any of the conditions 1 to 3 of Table 1, for example, may be used as the second set of etching conditions. Film reduction of the gate insulating film 1502 can thus be suppressed by performing the first etching process at two sets of etching conditions. (See FIG. 19B.)

Figure 19B:
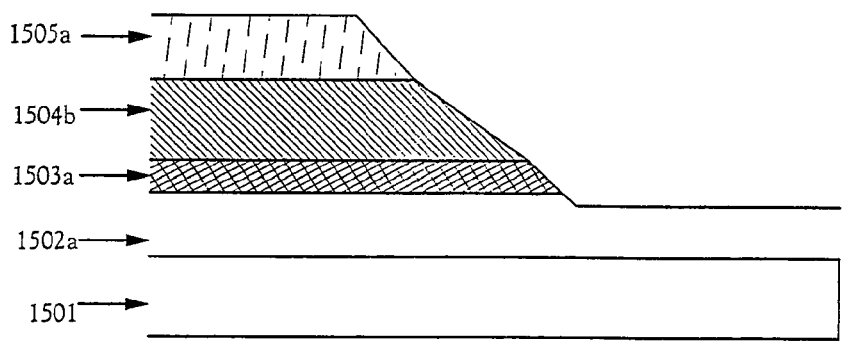

Note that the first shape second conduction latter 1504a in FIG. 19B is also etched somewhat when performing etching under the second set of etching conditions, but the amount is microscopic (approximately 0.15 μm. namely 0.3 μm of the overall line width), and therefore it is shown in the figure as having the same shape as in FIG. 19A.

Figure 19C:
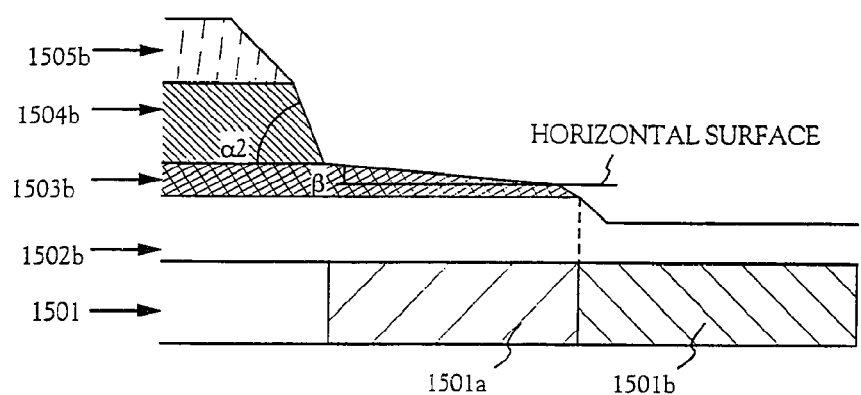
Figure 19D:
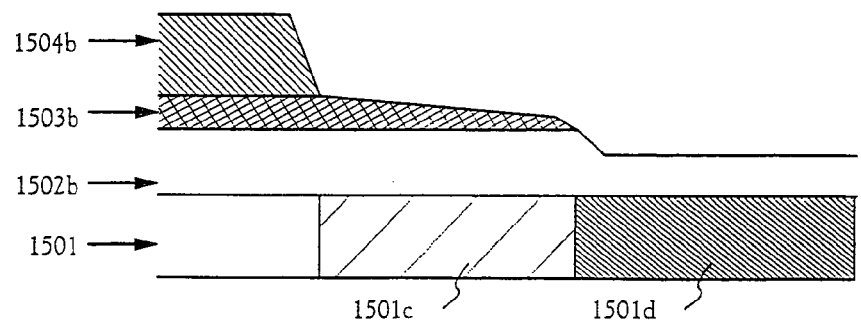

A second etching process is performed next with the mask 1550a left in place as is, and a second shape conducting layer shown in FIG. 19C is obtained. Etching is performed under etching conditions using a mixed gas made from CF$_4$, Cl$_2$, and O$_2$ as the second etching process in Embodiment 11. Any of the conditions 4 to 15 of Table 1 may be used for the etching conditions here, and the etching time may be suitably determined. Further, the width of each conducting layer in the channel longitudinal direction can be freely set in accordance with the etching conditions. A second shape mask 1505b, a second shape first conducting layer 1503b, a second shape second conducting layer 1504b, and a second shape gate insulating film 1502b are formed by the second etching process.

Note that the second shape first conducting layer 1503b corresponds to the first gate electrode, and that the second shape second conducting layer 1504b corresponds to the second gate electrode in Embodiment 11.

A taper angle α2, which is larger than the taper angle α1, is formed in the second shape second conducting layer 1504b, and an extremely small taper angle β is formed in the second shape first conducting layer 1503b.

A first doping process is performed next with the mask 1505b left in place as is. (See FIG. 19C.) N-type conductivity imparting phosphorous is added to the semiconductor layer 1501 here using ion doping with the second shape second conducting layer 1504b as a mask. Further, the first doping process is performed in a state in which the mask 1505b remaining as is here, but the first doping process may also be performed after removing the mask 1505b.

Impurity regions 1501a and 1501b are formed in accordance with the first doping process. Further, the semiconductor layer overlapping the second conducting layer, sandwiching the gate insulating film and the first conducting layer, becomes a channel forming region. Note that, although not shown in the figures, the impurity regions 1501a and 1501b are formed on both sides of the channel forming region, and have linear symmetry.

Further, the ion introduction depth in doping becomes shallower the thicker the film thickness of the material layer arranged over the semiconductor layer becomes. Therefore, the impurity region 101a which overlaps with the first conducting layer, sandwiching the gate insulating film, namely a first LDD region (Lov region) is influenced by the tapered portion having the sidewall with the taper angle β, and the concentration of the impurity element added within the semiconductor layer changes. The impurity element concentration decreases the thicker the film thickness becomes, and the impurity element concentration increases the thinner the film thickness becomes.

Further, there are also cases in which a tapered portion is formed in the gate insulating film in accordance with the etching conditions when performing the second etching process. The semiconductor layer is also influenced by this tapered portion in such cases, and the concentration of the impurity element added within the semiconductor film changes.

On the other hand, the film thickness of the gate insulating film is nearly constant in the impurity region 1501b which does not overlap with the first conducting layer, and the second LDD region (Loff region), and therefore the impurity concentration is nearly constant.

Although not shown in the figures, a resist mask is formed next, covering a portion of the switching TFT. The length of the Loff region in the switching TFT is determined here by controlling the size of the resist mask.

A second doping process is performed next. An impurity element which imparts a one conductivity type to a semiconductor, n-type conductivity imparting phosphorus, is added here to the semiconductor layer 1501 using ion doping with the second shape first conducting layer 1503b and the second shape second conducting layer 1504b as masks. The second doping process performs doping of a higher concentration than in the first doping process, and impurity regions 1501c and 1501d are formed.

In addition to the impurity concentration added by the first doping process, the impurity region 1501d, namely a source region or a drain region, becomes even more high concentration in accordance with the second doping process.

Further, the impurity region 1501c is not doped because it overlaps with the first conducting layer, and it has the identical concentration distribution as the impurity region 1501a. The impurity region 1501c is therefore also a first LDD region. However, it becomes further high concentration depending upon the doping conditions. In that case, it is influenced by the tapered portion having a side with a taper angle β in the second doping process, similar to the first doping process, and the impurity is added within the semiconductor layer.

On the other hand, only regions of the switching TFT not covered by the resist mask are doped, forming source regions or drain regions. Further, the second LDD region 1501b, which is covered by the resist mask and does not overlap with the conducting, layer, remains as is.

The resist mask of the switching TFT is removed next.

The EL panel of FIG. 6B may be manufactured by performing subsequent processing in accordance with the processes of Embodiment 1 from FIG. 4C onward.

The driver circuit n-channel TFT and the switching TFT are thus separately made in accordance with the above method.

The driver circuit n-channel TFT is prepared with a channel forming region overlapping with a second conducting layer, sandwiching a gate insulating film; first LDD regions on both sides of the channel forming region; and source regions or drain regions contacting the first LDD regions. The switching TFT is prepared with: a channel forming region overlapping a second conducting layer, sandwiching a gate insulating film; first LDD regions on both sides of the channel forming region; second LDD regions contacting the first LDD regions; and source regions or drain regions contacting the second LDD regions.

Further, the first LDD regions overlapping the first conducting layer, sandwiching the gate insulating film, have an impurity element concentration distribution which increases as distance from the channel forming region increases. Note that the impurity concentration in the first LDD region contains a region having a concentration gradient in a range of at least $1 \times 10^{17}$ to $1 \times 10^{18}$ atoms/cm$^3$. Provided that the LDD region has this type of continuous concentration distribution, it is effective in lowering the off current. Further, reliability increases the longer the length in the channel longitudinal direction in the first LDD region becomes.

In practice, the boron included in the regions 149 to 152 with respect to a boron doping process (see FIG. 4C) in the electric current control TFT is also influenced by the thickness of the first conducting layer in which a taper is positioned on the semiconductor layer similar to the first doping process, and the concentration of the impurity element added within the impurity region changes. The impurity concentration is reduced the thicker the film thickness becomes, and the impurity concentration increases the thinner the film thickness becomes.

Note that it is possible to freely combine Embodiment 11 with any of Embodiments 1 to 10.

Furthermore, the selectivity with the gate insulating film 1502 is extremely high when the etching gas of Embodiment 11 (gas mixture of CF$_4$ and Cl$_3$) is substituted by a gas mixture of SF$_6$ and Cl$_2$, or when the gas mixture of CF$_4$, Cl$_2$, and O$_2$ is substituted by a gas mixture of SF$_6$, Cl$_2$, and O$_2$, and therefore the film reduction can be additionally suppressed.

Embodiment 12

By using an EL material in which phosphorescence from a triplet state excitation can be utilized in light emission in the present invention, the external light emission quantum efficiency can be increased by a large amount. By doing so, it becomes possible to make the EL element into a low power consumption, long life, and low weight.

A report of utilizing triplet state excitations and increasing the external light emission quantum efficiency are shown in the following paper. Tsutsui, T., Adachi, C., and Saito, S., Photochemical Processes in Organized Molecular Systems, Ed. Honda, K., Elsevier Sci. Pub., Tokyo, 1991, p. 437.

The molecular formula of the EL material (coumarin pigment) reported in the above paper is shown below.

[CHEM 1]

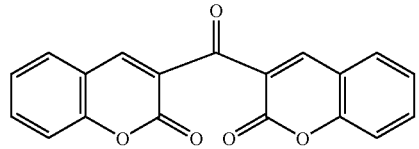

Baldo, M. A., O'Brien, D. F., You, Y., Shoustikov, A., Sibley, S., Thompson, M. E., and Forrest, S. R., Nature 395 (1998) p. 151.

The molecular formula of the EL material (Pt complex) reported in the above paper is shown below.

[Chem 2]

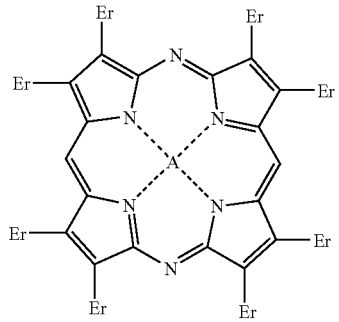

Baldo, M. A., Lamansky, S., Burrows, P. E., Thompson, M. E., and Forrest, S. R., Appl. Phys. Lett., 75 (1999) p. 4, and Tsutsui, T., Yang, M. J., Yahiro, N., Nakamura, K., Watanabe, T G., Tsuji, T., Fukuda, Y., Wakimoto, T., and Mayaguchi, S., Japan Appl. Phys., 38 (12B) 1999, L1502.

The molecular formula of the EL material (Ir complex) reported in the above paper is shown below.

[Chem 3]

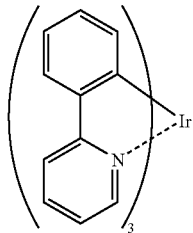

Provided chat the phosphorescence emission from triplet state excitations can be utilized, then in principle it is possible to realize an external light emission quantum efficiency which is 3 to 4 times higher than that for cases of using the fluorescence emission from singlet state excitations.

Note that it is possible to implement the constitution of Embodiment 12 by freely combining it with the construction of any of Embodiments 1 to 11.

Embodiment 13

The EL display device fabricated in accordance with the present invention is of the self-emission type, and thus exhibits more excellent recognizabiity of the displayed image in a light place as compared to the liquid crystal display device. Furthermore, the EL display device has a wider viewing angle. Accordingly the EL display device can be applied to a display portion in various electronic devices. For example, in order to view a TV program or the like on a large-sized screen, the EL display device in accordance with the present invention can be used as a display portion of an EL display device (i.e., a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggles-type display (head mount display), a navigation system, a sound reproduction device (an car audio equipment, an audio set or the like), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital versatile disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 16A to 17B respectively show various specific examples of such electronic devices.

Figure 16A:
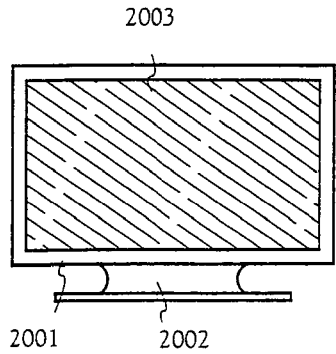
FIGS. 16A to 16F are electronic equipments using an EL display device of Embodiment 13.

FIG. 16A illustrates an EL image display device which includes a frame 2001, a support table 2002, an EL display portion 2003, or the like. The present invention is applicable to the display portion 2003. The EL display is of the EL display type and therefore requires no back light. Thus, the display portion thereof can have a thickness thinner than that of the liquid crystal display device.

Figure 16B:
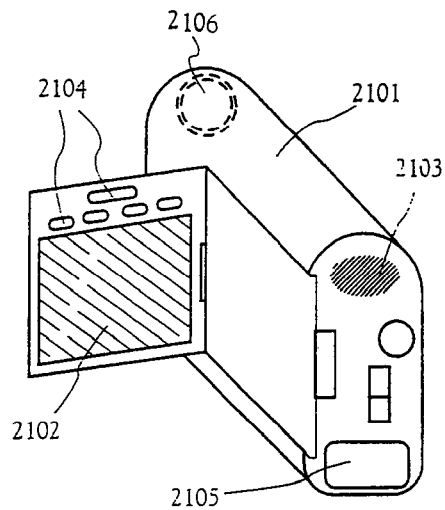

FIG. 16B illustrates a video camera which includes a main body 2101, a display portion 2102, an audio input portion 2103, operation switches 2104, a battery 2105, an image receiving portion 2106, or the like. The self-emission device in accordance with the present invention can be used as the EL display portion 2102.

Figure 16C:
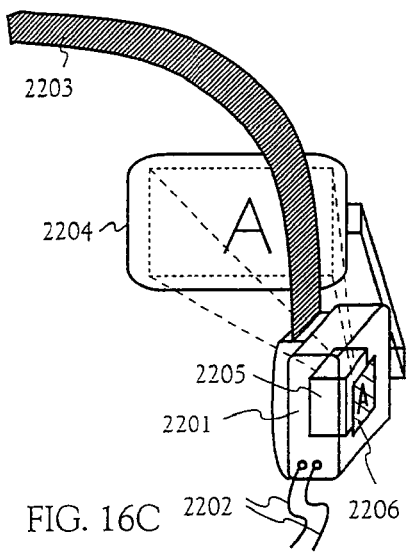

FIG. 16C illustrates a portion (the right-half piece) of display device of head mount type, which includes a main body 2201, signal cables 2202, a head mount band 2203, a screen portion 2204, an optical system 2205, an self-emission device 2206, or the like. The present invention is applicable to the EL display device 2206.

Figure 16D:
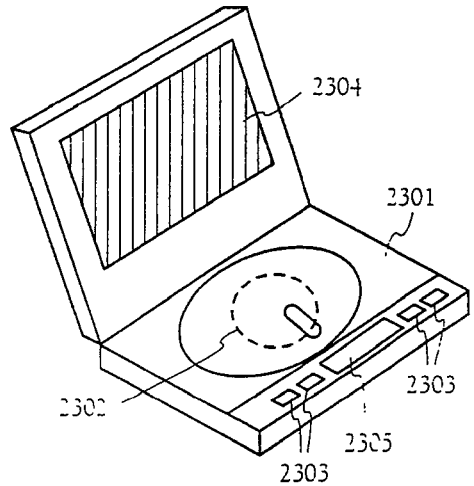

FIG. 16D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) 2304 is used mainly for displaying image information, while the display portion (b) 2305 is used mainly for displaying character information. The EL display device in accordance with the present invention can be used as these display portions (a) 2304 and (b) 2305. The image reproduction apparatus including a recording medium further includes a game machine or the like.

Figure 16E:
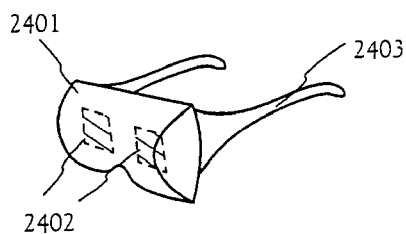

FIG. 16E illustrates a goggle type display (head mounted display), which includes a main body 2401, a display portion 2402 and an arm portion 2403 or the like. The EL display device in accordance with the present invention is applicable to the display portion 2402.

Figure 16F:
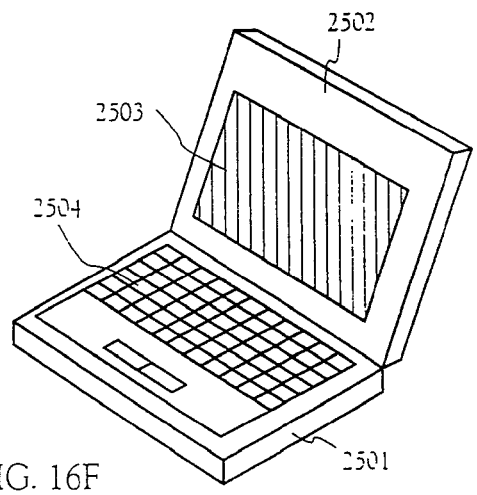

FIG. 16F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or an audio equipment, it is desirable to drive the EL display device so that the character information is formed by a light-emitting portion while a non-emission portion corresponds to the background.

Figure 17A:
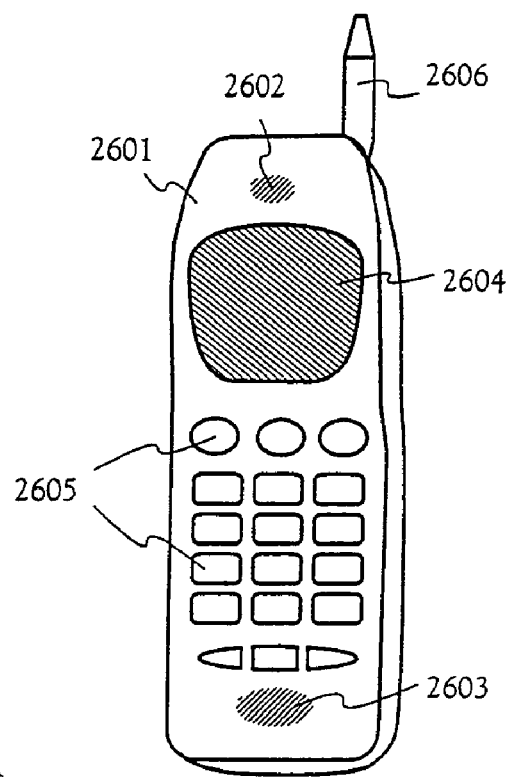
FIGS. 17A and 17B are electronic equipments using an EL display device of Embodiment 13.

With now reference to FIG. 17A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 17B:
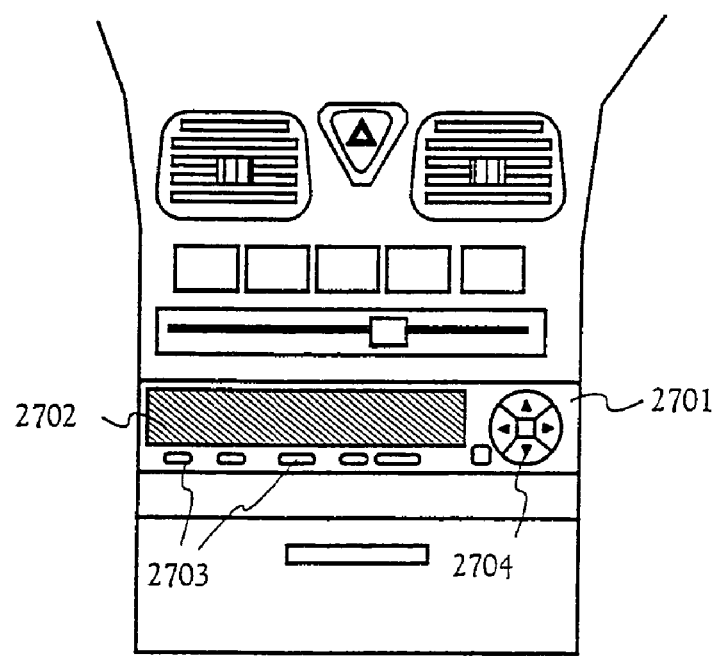

FIG. 17B illustrates a sound reproduction device, a car audio equipment in concrete term, which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to an audio of the portable type or home set type. The display portion 2702 can reduce power consumption by displaying white-colored characters on a black-colored background, which is particularly advantageous for the audio of the portable type.

As set forth above, the present invention can be applied variously to a wide range of electronic devices in all fields. The electronic device in the present embodiment can be obtained by utilizing an EL display device having the configuration in which the structures in Embodiments 1 through 12 are freely combined.

Embodiment 14

A second shape first gate electrode (TaN) becomes various shapes in accordance with etching conditions such as those recorded in Embodiment 11. A simulation and a comparison are performed in Embodiment 14 on a shape A of FIG. 20A and a shape B of FIG. 20B.

Figure 20A:
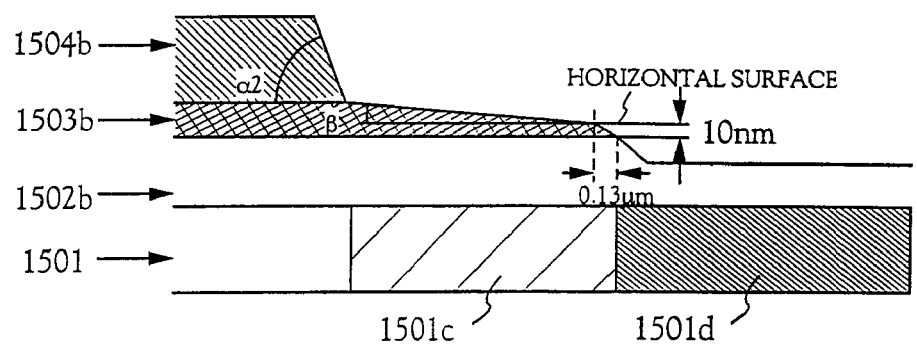
FIGS. 20A and 20B are enlarged diagrams of a TFT gate electrode of Embodiment 14.
Figure 21:
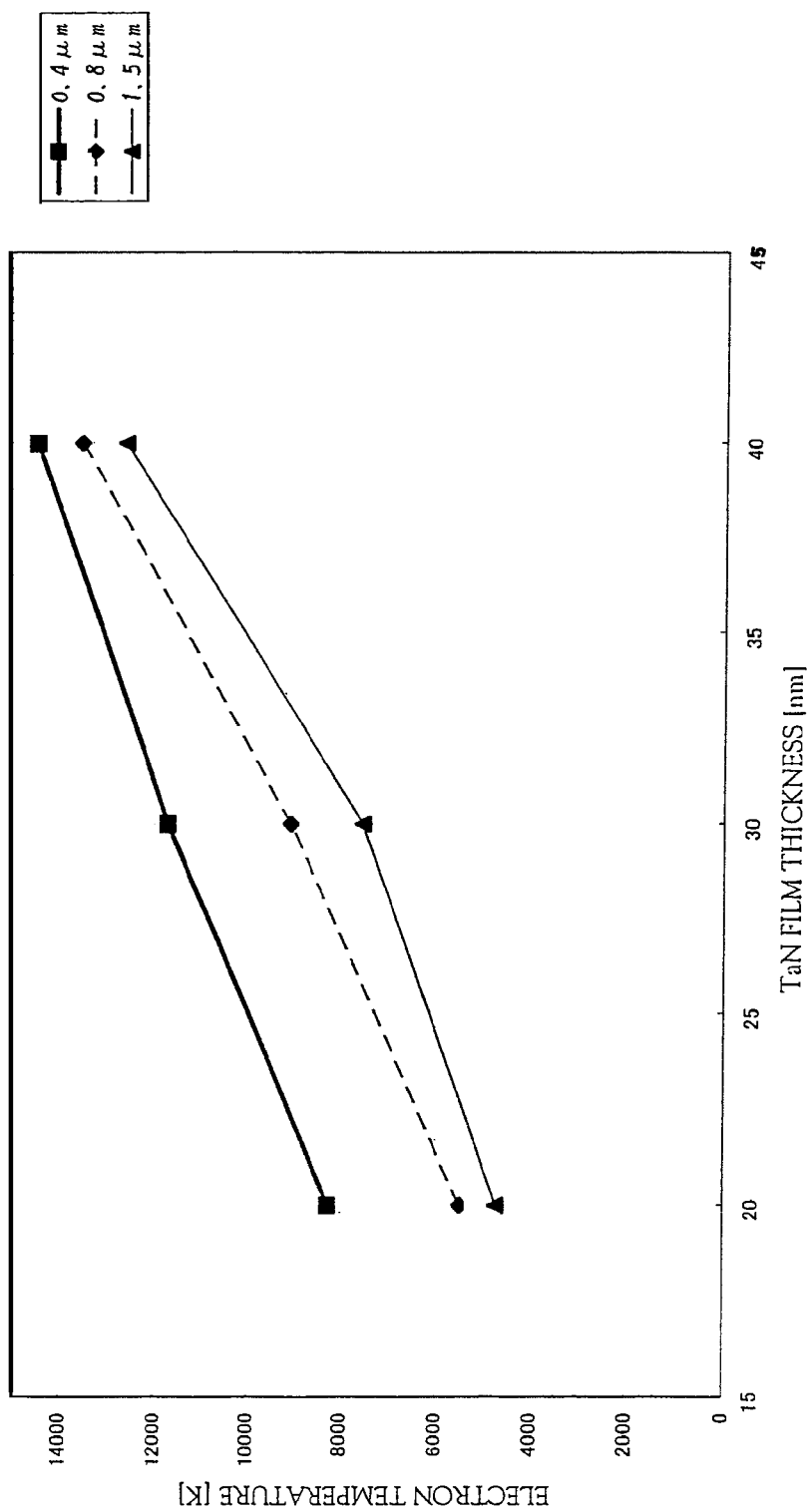
FIG. 21 is a graph showing the relationship between TaN film thickness and electron temperature in a shape A of Embodiment 14.
Figure 24:
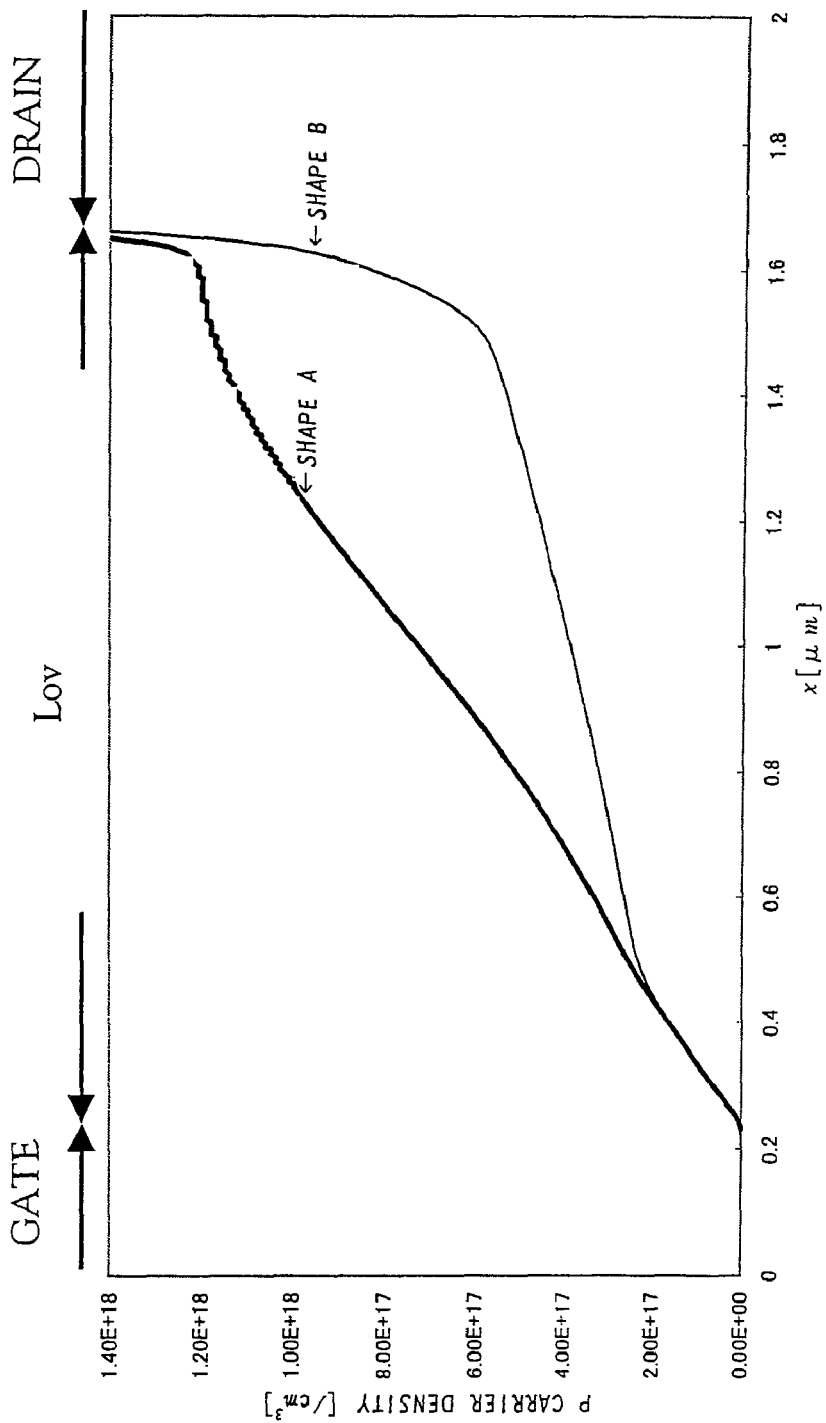
FIG. 24 is a diagram showing the concentration distribution of phosphorus in a shape A and a shape B of Embodiment 14.

The shape A shown in Embodiment 11 is shown in FIG. 20A. FIG. 20A is identical to FIG. 19D, and therefore the same reference symbols are used. FIG. 21 is a graph showing the relationship with electron temperature for cases of setting the Lov length (the length of Lov region in the channel longitudinal direction) to 0.4 μm, 0.8 μm, and 1.5 μm with a film thickness of the first gate electrode (TaN) set from 15 to 40 nm. Note that the simulation was performed using the impurity element concentration distribution in the channel longitudinal direction (the concentration distribution at a depth of 10 nm from the surface of the semiconductor layer) shown in FIG. 24. However, the simulation was performed with the taper angle changed in a portion of the first gate electrode sidewall, and the locations of the changes are positions of 10 nm of film thickness from the gate insulating film as seen in cross section, and at positions separated by 0.13 μm from the first gate electrode edge portion when seen from the top surface.

Figure 20B:
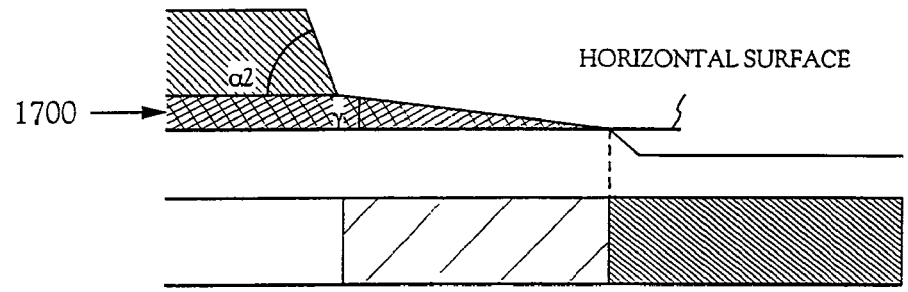

Further, FIG. 20B shows the shape B of Embodiment 14. FIG. 20B differs from FIG. 20A, and there are no locations in which the taper angle changes in a portion of the sidewall. A taper angle γ is formed.

Figure 22:
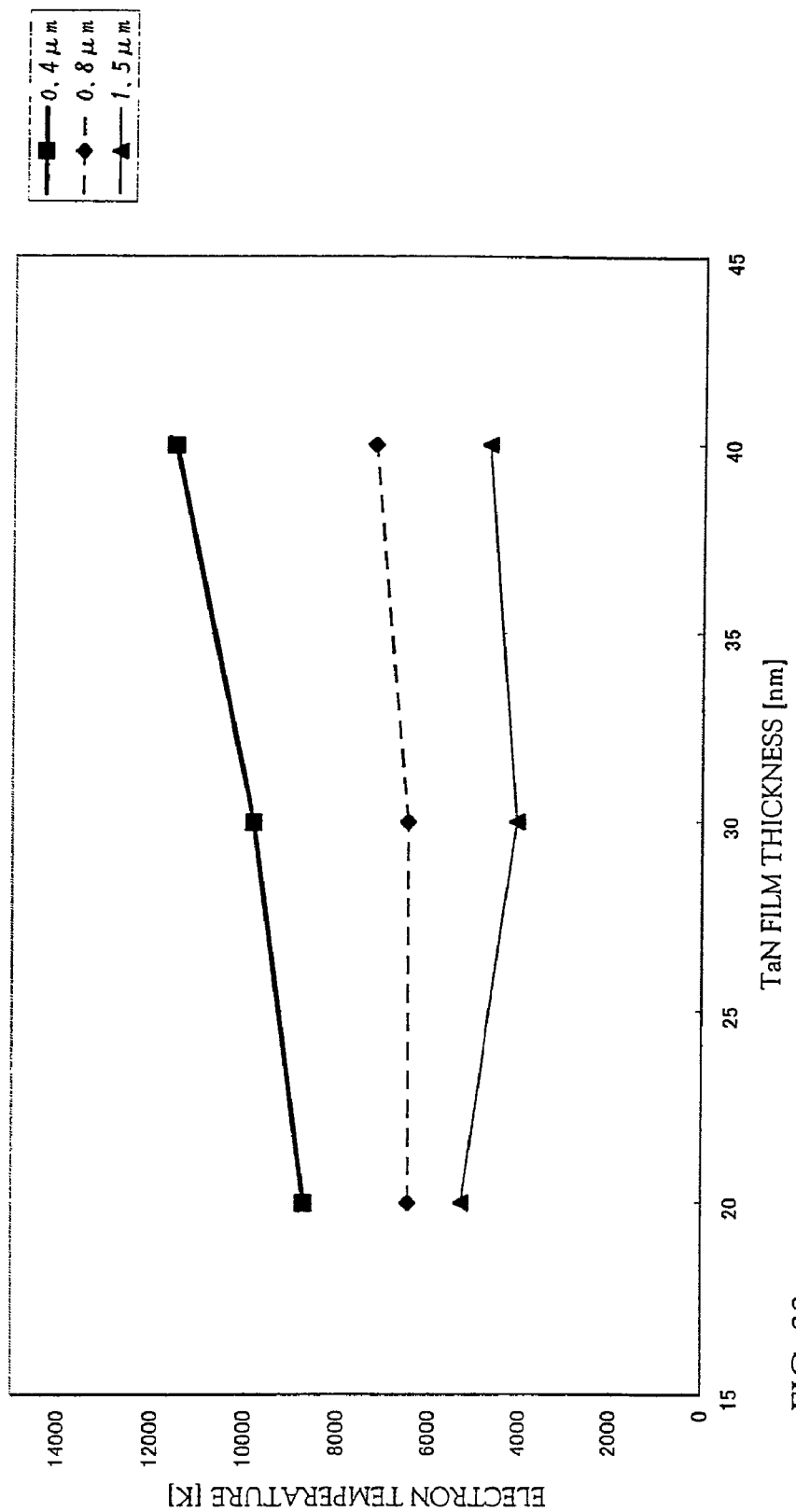
FIG. 22 is a graph showing the relationship between TaN film thickness and electron temperature in a shape B of Embodiment 14.

The simulation is similarly performed in a first gate electrode 1700 shown in FIG. 20B, and the relationship between the electron temperature for cases in which the Lov length is 0.4 μm, 0.8 μm, and 1.5 μm, with the film thickness of the first gate electrode (TaN) set from 15 to 40 nm, is shown in FIG. 22. Note that the simulation is performed using the concentration distribution of the impurity element in the channel longitudinal direction shown in FIG. 24.

Figure 23:
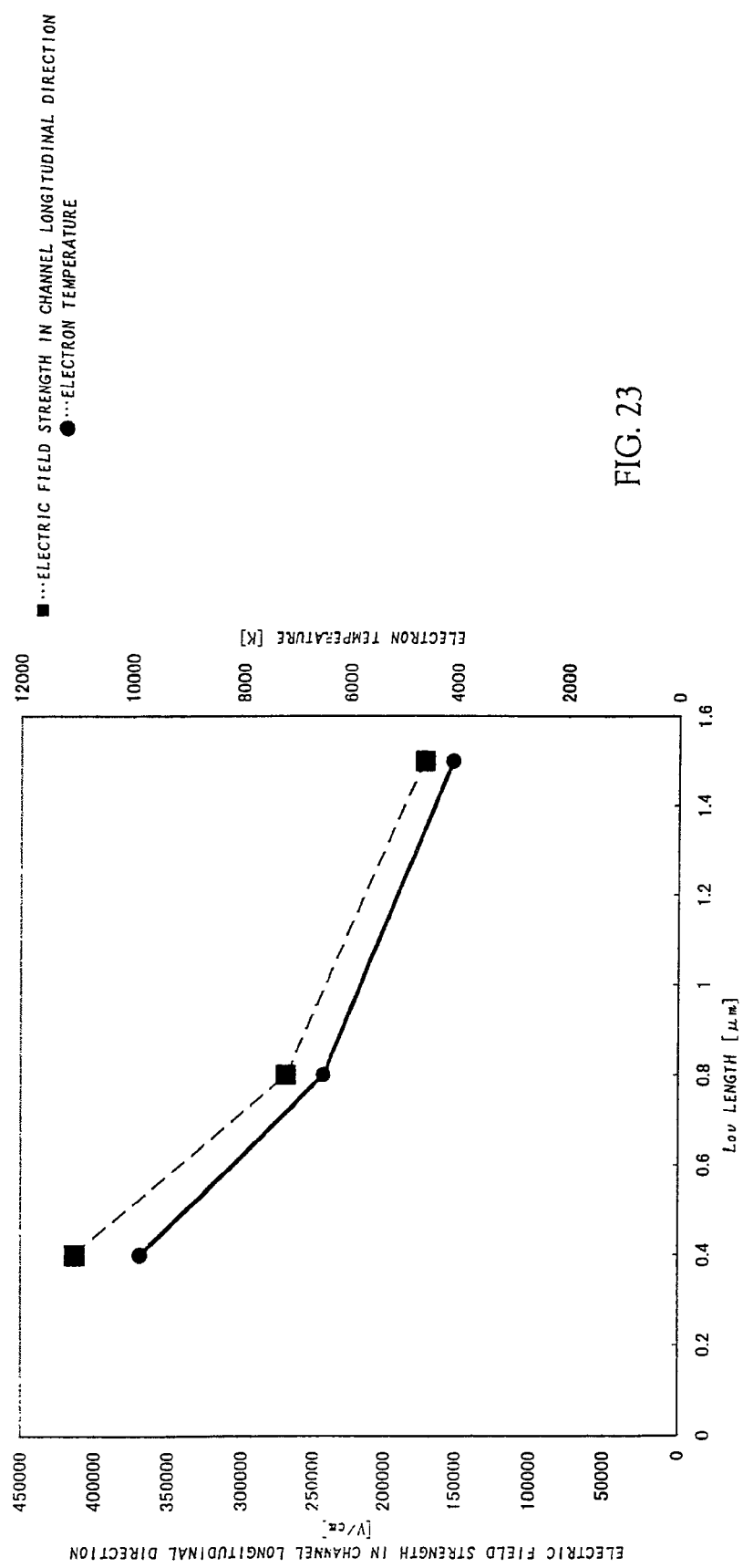
FIG. 23 is a comparison of electron temperature and horizontal direction electric field strength in a shape B of Embodiment 14.

Further, the first gate electrode 1700 shown in FIG. 20B, namely when the TaN film thickness is 30 nm, the relationship between the electric field strength in the channel longitudinal direction and the Lov length, and the relationship between the Lov length and the electron temperature are shown in FIG. 23. The tendencies shown in FIG. 23 of the electric field structure and the electron temperature are approximately the same. It can be said, therefore, that the lower the electron temperature, the less the tendency for the degree of the TFT to degrade.

When comparing FIG. 22 and FIG. 23, the shape of FIG. 20B shown in FIG. 22 shows a lower electron temperature. In other words, seen from the viewpoint of TFT degradation, using the shape of FIG. 20B is preferable because the electron temperature can be lowered.

Further, when the Lov length is 1.5 μm, the electron temperature is low, and therefore it can be inferred that a long Lov length is preferable.

It is possible to freely combine Embodiment 14 with any, of Embodiments 1 to 13.

The length of the gate electrodes in the channel longitudinal direction (hereafter referred to simply as gate electrode width) differ as stated above with the present invention, and therefore it is possible to make the ion concentration within the semiconductor layers arranged under the first gate electrode less than the ion concentration within the semiconductor layers not arranged under the first gate electrode by utilizing the difference in ion penetration depth, due to the differing gate electrode thicknesses, when performing ion injection using the gate electrodes as masks.

Further, the Loff regions are formed using a mask, and therefore only the width of the first gate electrode and the width of the second gate electrode must be controlled by etching. Control of the Loff region and Lov region positions becomes easier compared to the conventional examples. It therefore becomes easy to have precise positional alignment of the Lov regions and the Loff regions, and it becomes easy to manufacture TFTs having desired characteristics.

Furthermore, the electric power source supply line, which is conventionally formed from the same film as the gate signal line or the source signal line, is formed between the second interlayer insulating film and the third interlayer insulating film. The electric power source supply line can thus overlap with the gate signal line, and the aperture ratio can therefore be increased.

What is claimed is:

1. A semiconductor device comprising:
   a semiconductor film over an insulating surface;
   a gate insulating film over the semiconductor film;
   a first conductive layer and a first capacitor wiring over the gate insulating film;
   a second conductive layer over the first conductive layer;
   a second capacitor wiring over the first capacitor wiring;
   a first insulating layer over the second conductive layer and the second capacitor wiring;
   a second insulating layer over the first insulating layer, the second insulating layer having a first contact hole over the second capacitor wiring;
   a first wiring in the first contact hole and over a part of the second insulating layer;
   a third insulating layer over the first wiring and the second insulating layer; and
   a second wiring over the third insulating layer, in a second hole formed in the third insulating layer and in a third contact hole formed in the first, second and third insulating layers,
   wherein the semiconductor film includes:
      a channel forming region,
      LDD regions in contact with the channel forming region, and
      a source region and a drain region in contact with the LDD regions,
   wherein an end portion of the first conductive layer extends beyond an end portion of the second conductive layer,
   wherein the LDD regions overlap the first conductive layer with the gate insulating film interposed therebetween,
   wherein the second conductive layer has a tapered shape in an end portion of the second conductive layer in cross section,
   wherein the first conductive layer comprises at least a first element selected from the group consisting of Ta, W, Ti, Mo, Al, and Cu and the second conductive layer comprises at least a second element selected from the group consisting of Ta, W, Ti, Mo, Al, and Cu,
   wherein the first element is different from the second element,
   wherein an element in the first capacitor wiring is a same as the first element and an element in the second capacitor wiring is a same as the second element, and
   wherein the semiconductor film and the second capacitor wiring are electrically connected to each other via the first wiring and the second wiring.

2. A semiconductor device according to claim 1, wherein the channel forming region overlaps the second conductive layer with the gate insulating film interposed therebetween.

3. A semiconductor device according to claim 1 further comprising an EL element,
   wherein the EL element comprises:
      an anode;
      a cathode; and
      an EL layer formed between the anode and the cathode, wherein the drain region is electrically connected to one of the anode and the cathode.

4. A semiconductor device according to claim 3, wherein the source region is electrically connected to the first wiring.

5. A semiconductor device according to claim 1, wherein the first conductive layer has a tapered shape in an end portion thereof in cross section.

6. A semiconductor device according to claim 1,
wherein the LDD regions includes a portion having a concentration gradient of impurity in a range of 1×1017 to 1×1018 atoms/cm3, and
wherein the concentration of the impurity increases as a distance from the channel forming region increases.

7. A semiconductor device according to claim 1,
wherein the first conductive layer and the second conductive layer are in contact with the first insulating layer.

8. A semiconductor device according to claim 1, wherein the semiconductor device is one selected from the group consisting of an EL display device, a video camera, a digital camera, a head mount display, a sound reproduction device, an image reproduction device, a personal computer and a portable telephone.

9. A semiconductor device comprising:
a semiconductor film over an insulating surface;
a gate insulating film over the semiconductor film;
a first conductive layer and a first capacitor wiring over the gate insulating film;
a second conductive layer over the first conductive layer;
a second capacitor wiring over the first capacitor wiring;
a first insulating layer over the second conductive layer and the second capacitor wiring;
a second insulating layer over the first insulating layer, the second insulating layer having a first contact hole over the second capacitor wiring;
a first wiring in the first contact hole and over a part of the second insulating layer;
a third insulating layer over the first wiring and the second insulating layer; and
a second wiring over the third insulating layer, in a second contact hole formed in the third insulating layer and a third contact hole formed in the first, second and third insulating layers,
wherein the semiconductor film includes:
a channel forming region,
LDD regions in contact with the channel forming region, and
a source region and a drain region in contact with the LDD regions,
wherein an end portion of the first conductive layer extends beyond an end portion of the second conductive layer,
wherein the second conductive layer has a tapered shape in an end portion of the second conductive layer in cross section,
wherein the LDD regions overlap the first conductive layer with the gate insulating film interposed therebetween,
wherein the first conductive layer comprises tantalum, and the second conductive layer comprises tungsten, and
wherein the semiconductor film and the second capacitor wiring are electrically connected to each other via the first wiring and the second wiring.

10. A semiconductor device according to claim 9, wherein the channel forming region overlaps the second conductive layer with the gate insulating film interposed therebetween.

11. A semiconductor device according to claim 9, further comprising an EL element,
wherein the EL element comprises:
an anode;
a cathode; and
an EL layer being formed between the anode and the cathode,
wherein the drain region is electrically connected to one of the anode and the cathode.

12. A semiconductor device according to claim 11, wherein the source region is electrically connected to the first wiring.

13. A semiconductor device according to claim 9, wherein the first conductive layer has a tapered shape in an end portion thereof in cross section.

14. A semiconductor device according to claim 9,
wherein the first conductive layer and the second conductive layer are in contact with the first insulating layer.

15. A semiconductor device according to claim 9, wherein the semiconductor device is one selected from the group consisting of an EL display device, a video camera, a digital camera, a head mount display, a sound reproduction device, an image reproduction device, a personal computer and a portable telephone.

16. A semiconductor device according to claim 9, wherein the first conductive layer is tantalum nitride.

17. A semiconductor device comprising:
a semiconductor film over an insulating surface;
a gate insulating film over the semiconductor film;
a first conductive layer and a first capacitor wiring over the gate insulating film; and
a second conductive layer over the first conductive layer,
a second capacitor wiring over the first capacitor wiring;
a first insulating layer over the second conductive layer and the second capacitor wiring;
a second insulating layer over the first insulating layer, the second insulating layer having a first contact hole over the second capacitor wiring;
a first wiring in the first contact hole and over a part of the second insulating layer;
a third insulating layer over the first wiring and the second insulating layer; and
a second wiring over the third insulating layer, in a second hole formed in the third insulating layer and in a third contact hole formed in the first, second and third insulating layers,
wherein the semiconductor film includes:
a channel forming region,
LDD regions in contact with the channel forming region, and
a source region and a drain region in contact with the LDD regions,
wherein an end portion of the first conductive layer extends beyond an end portion of the second conductive layer,
wherein the second conductive layer has a tapered shape in an end portion of the second conductive layer in cross section,
wherein the LDD regions overlap the first conductive layer with the gate insulating film interposed therebetween, and
wherein the first conductive layer comprises titanium, and the second conductive layer comprises aluminum.

18. A semiconductor device according to claim 17, wherein the channel forming region overlaps the second conductive layer with the gate insulating film interposed therebetween.

19. A semiconductor device according to claim 17, wherein the first conductive layer has a tapered shape in an end portion thereof in cross section.

20. A semiconductor device according to claim 17, wherein the semiconductor device is one selected from the group consisting of an EL display device, a video camera, a digital camera, a head mount display, a sound reproduction device, an image reproduction device, a personal computer and a portable telephone.

21. A semiconductor device comprising:
a semiconductor film over an insulating surface;
a gate insulating film over the semiconductor film; and
a gate electrode comprising:
a first conductive layer over the gate insulating film; and
a second conductive layer over the first conductive layer,
wherein the semiconductor film includes:
   a channel forming region,
   LDD regions in contact with the channel forming region, and
   a source region and a drain region in contact with the LDD regions,
wherein an end portion of the first conductive layer extends beyond an end portion of the second conductive layer,
wherein the second conductive layer has a tapered shape in an end portion of the second conductive layer in cross section,
wherein the LDD regions overlap the first conductive layer with the gate insulating film interposed therebetween,
wherein the first conductive layer comprises titanium, and the second conductive layer comprises aluminum,
wherein the semiconductor film is electrically connected to an EL element,
wherein the EL element comprises:
   an anode;
   a cathode; and
   an EL layer being formed between the anode and the cathode, and
wherein the drain region is electrically connected to one of the anode and the cathode.

22. A semiconductor device comprising:
a semiconductor film over an insulating surface;
a gate insulating film over the semiconductor film; and
a gate electrode comprising:
a first conductive layer over the gate insulating film; and
a second conductive layer over the first conductive layer,
wherein the semiconductor film includes:
   a channel forming region,
   LDD regions in contact with the channel forming region, and
   a source region and a drain region in contact with the LDD regions,
wherein an end portion of the first conductive layer extends beyond an end portion of the second conductive layer,
wherein the second conductive layer has a tapered shape in an end portion of the second conductive layer in cross section,
wherein the LDD regions overlap the first conductive layer with the gate insulating film interposed therebetween, and
wherein the first conductive layer comprises titanium, and the second conductive layer comprises aluminum,
wherein an insulating layer is formed over the second conductive layer, and
wherein the first conductive layer and the second conductive layer are in contact with the insulating layer.

23. A semiconductor device comprising: a semiconductor film over an insulating surface;
a gate insulating film over the semiconductor film;
a gate electrode and a capacitor wiring over the gate insulating film;
a first insulating layer over the gate electrode and the capacitor wiring;
a second insulating layer over the first insulating layer, the second insulating layer having a first contact hole over the capacitor wiring;
a first wiring in the first contact hole and over a part of the second insulating layer;
a third insulating layer over the first wiring and the second insulating layer; and
a second wiring over the third insulating layer, in a second hole formed in the third insulating layer and a third contact hole formed in the first, second and third insulating layers,
wherein the semiconductor film includes:
   a channel forming region, and
   a source region and a drain region, and
wherein the semiconductor film and the capacitor wiring are electrically connected to each other via the first wiring and the second wiring.

24. A semiconductor device according to claim 23, wherein the channel forming region overlaps the gate electrode with the gate insulating film interposed therebetween.

25. A semiconductor device according to claim 23 further comprising an EL element,
wherein the EL element comprises:
   an anode;
   a cathode; and
   an EL layer formed between the anode and the cathode, and
wherein the drain region is electrically connected to one of the anode and the cathode.

26. A semiconductor device according to claim 25, wherein the source region is electrically connected to the first wiring.

27. A semiconductor device according to claim 23, wherein the first conductive layer has a tapered shape in an end portion thereof in cross section.

28. A semiconductor device according to claim 23, wherein the first conductive layer and the second conductive layer are in contact with the first insulating layer.

* * * * *

UNITED STATES PATENT AND TRADEMARK OFFICE
CERTIFICATE OF CORRECTION

Page 1 of 2

PATENT NO. : 8,124,973 B2
APPLICATION NO. : 11/469768
DATED : February 28, 2012
INVENTOR(S) : Shunpei Yamazaki et al.

It is certified that error appears in the above-identified patent and that said Letters Patent is hereby corrected as shown below:

In the Specification

Column 3, line 38, replace "date" with --gate--;

Column 4, line 58, replace "lawyer" with --layer--;

Column 5, line 15, replace "mar" with --may--;

Column 7, line 7, replace "crate" with --gate--;

Column 10, line 47, replace "chancel" with --channel--;

Column 10, line 62, replace "or" with --of--;

Column 11, line 41, replace "9" with --10--;

Column 12, line 63, replace "311" with --313--;

Column 13, line 60, replace "sate" with --gate--;

Column 14, line 26, replace "rate" with --gate--;

Column 15, line 32, replace "de-ice" with --device--;

Column 16, line 2, replace "00" with --100--;

Column 17, line 16, replace "500W" with --50W--;

Column 18, line 5, replace "or" with --of--;

Column 18, line 26, replace "13S" with --138--;

Column 18, line 36, replace "111" with --151--;

Signed and Sealed this
Twenty-fifth Day of February, 2014

Michelle K. Lee
*Deputy Director of the United States Patent and Trademark Office*

CERTIFICATE OF CORRECTION (continued)
U.S. Pat. No. 8,124,973 B2

Column 19, line 31, replace "15D" with --155--;

Column 19, line 59, replace "tape" with --type--;

Column 19, line 66, replace "formed" with --from--;

Column 20, line 1, replace "(benzo)cyclobutene)" with --benzocyclobutene--;

Column 20, line 33, replace "110" with --170--;

Column 20, line 43, replace "20" with --200--;

Column 20, line 44, replace "a 1-0" with --120--;

Column 26, line 1, replace "layers" with --lasers--;

Column 29, line 30, replace "hitch" with --high--;

Column 30, line 6, replace "ha" with --the--;

Column 30, line 13, replace "polyamide" with --polyimide--;

Column 30, line 49, replace "de % ice" with --device--;

Column 33, line 29, replace "latter" with --layer--;

Column 33, line 36, replace "1550a" with --1505a--;

Column 34, line 24, replace "101a" with --1501a--;

Column 35, line 1, replace "side" with --sidewall--;

Column 35, line 53, replace "Cl$_3$" with --Cl$_2$--;

Column 36, line 56, replace "chat" with --that--;

Column 36, line 63, replace "construction" with --constitution--;

Column 37, line 1, replace "recognizabiity" with --recognizability--.